United States Patent
Jung et al.

(10) Patent No.: US 12,080,710 B2
(45) Date of Patent: Sep. 3, 2024

(54) SEMICONDUCTOR DEVICES AND METHODS OF FABRICATING THE SAME

(71) Applicant: Samsung Electronics Co., Ltd., Suwon-si (KR)

(72) Inventors: Kyooho Jung, Seoul (KR); Young-Lim Park, Anyang-si (KR); Changmu An, Osan-si (KR); Hongseon Song, Suwon-si (KR); Yukyung Shin, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 609 days.

(21) Appl. No.: 17/361,418

(22) Filed: Jun. 29, 2021

(65) Prior Publication Data
US 2022/0085010 A1 Mar. 17, 2022

(30) Foreign Application Priority Data
Sep. 16, 2020 (KR) .......................... 10-2020-0119384

(51) Int. Cl.
*H01L 27/08* (2006.01)
*H01L 49/02* (2006.01)

(52) U.S. Cl.
CPC .......... *H01L 27/0805* (2013.01); *H01L 28/60* (2013.01)

(58) Field of Classification Search
CPC ............................ H01L 27/0805; H01L 28/60
USPC ........................................................ 257/532
See application file for complete search history.

(56) References Cited

U.S. PATENT DOCUMENTS

| 7,189,431 | B2 | 3/2007 | Yamasaki et al. |
| 7,564,114 | B2 | 7/2009 | Govindarajan |
| 8,569,158 | B2 | 10/2013 | Clark |
| 9,646,820 | B2 | 5/2017 | Pore et al. |
| 11,641,730 | B2 * | 5/2023 | Jung ............... H01L 28/40 438/239 |
| 2006/0166476 | A1 | 7/2006 | Lee et al. |
| 2012/0127629 | A1 | 5/2012 | Roeder et al. |
| 2013/0122681 | A1 | 5/2013 | Malhotra et al. |
| 2014/0060887 | A1 | 3/2014 | Singh et al. |
| 2014/0120683 | A1 | 5/2014 | Kim et al. |
| 2019/0353937 | A1 | 11/2019 | Switzer et al. |

(Continued)

FOREIGN PATENT DOCUMENTS

| KR | 100518235 B1 | 10/2005 |
| KR | 20060011425 A | 2/2006 |
| KR | 100564433 B1 | 3/2006 |

(Continued)

*Primary Examiner* — Monica D Harrison
(74) *Attorney, Agent, or Firm* — Myers Bigel, P.A.

(57) ABSTRACT

Disclosed are semiconductor devices and fabrication methods for the same. The semiconductor devices may include a bottom electrode, a dielectric layer, and a top electrode that are sequentially stacked on a semiconductor substrate. The bottom electrode includes a first doping region in contact with the dielectric layer, a main region spaced apart from the dielectric layer by the first doping region intervening therebetween, and a second doping region between the first doping region and the main region. Each of the first and second doping regions includes oxygen and a doping metal. In some embodiments, the second doping region may include nitrogen. The main region may be devoid of the doping metal. An amount of oxygen in the second doping region is less than an amount of oxygen in the first doping region.

20 Claims, 24 Drawing Sheets

(56) References Cited

U.S. PATENT DOCUMENTS

2020/0258888 A1    8/2020  Kim et al.

FOREIGN PATENT DOCUMENTS

KR         100799048 B1    1/2008
TW         201042681 A     12/2010

* cited by examiner

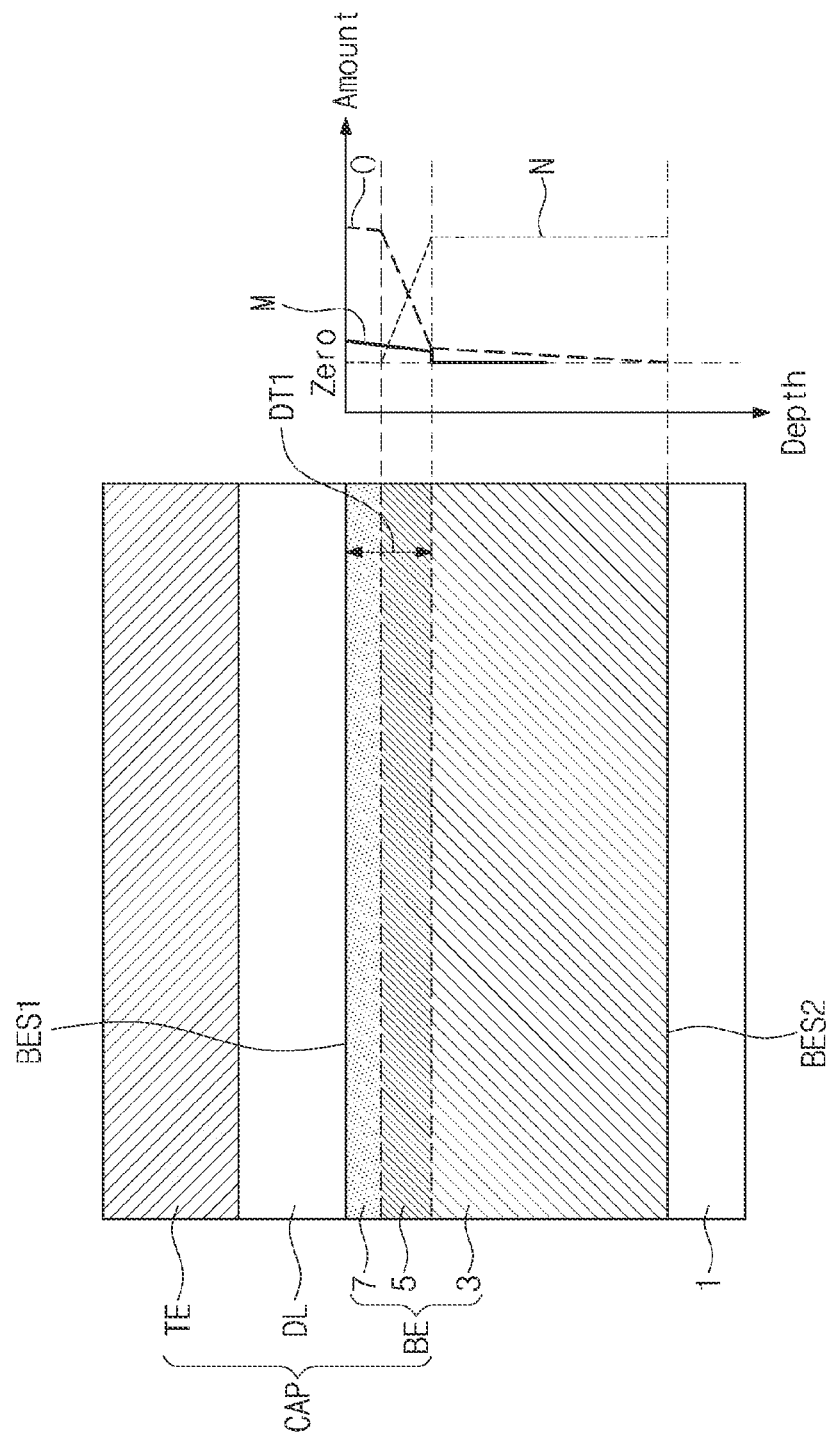

SEMICONDUCTOR DEVICES AND METHODS OF FABRICATING THE SAME

CROSS-REFERENCE TO RELATED APPLICATION

This U.S. nonprovisional application claims priority under 35 U.S.C § 119 to Korean Patent Application No. 10-2020-0119384 filed on Sep. 16, 2020 in the Korean Intellectual Property Office, the disclosure of which is hereby incorporated by reference in its entirety.

BACKGROUND

The present inventive concepts relate to a semiconductor device and a method of fabricating the same.

Semiconductor devices have an important role in the electronics industry because of their small size, multi-functionality, and/or low fabrication cost. The semiconductor devices are being highly integrated with the remarkable development of the electronics industry. Line widths of patterns of semiconductor devices are being reduced for high integration thereof. However, new exposure techniques and/or expensive exposure techniques may be used to form fine patterns such that it may be difficult to highly integrate semiconductor device. Various studies have thus recently been conducted for new integration techniques.

SUMMARY

Some example embodiments of the present inventive concept provide semiconductor devices capable of providing increased capacitance.

Some example embodiments of the present inventive concepts provide methods of fabricating a semiconductor device, which methods are capable of increasing a process yield.

According to some example embodiments of the present inventive concepts, semiconductor devices may include a bottom electrode, a dielectric layer, and a top electrode that are sequentially stacked on a semiconductor substrate. The bottom electrode may include: a first doping region in contact with the dielectric layer; a main region spaced apart from the dielectric layer by the first doping region intervening therebetween; and a second doping region between the first doping region and the main region. Each of the first and second doping regions may include oxygen and a doping metal. In some embodiments, the second doping region may include nitrogen. The main region may be devoid of the doping metal. An amount (e.g., a concentration) of oxygen in the second doping region may be less than an amount (e.g., a concentration) of oxygen in the first doping region.

According to some example embodiments of the present inventive concepts, semiconductor devices may include: a device isolation pattern on a substrate and defining an active section; a word line in the substrate and traversing or running across the active section; a first impurity region in the active section adjacent a first side of the word line; a second impurity region in the active section adjacent a second side of the word line; a bit line connected to the first impurity region and on (e.g., running across) the substrate; a bottom electrode connected to the second impurity region; a support pattern in contact with an upper portion of a side surface of the bottom electrode; a dielectric layer in contact with the support pattern and the bottom electrode; and a top electrode on the dielectric layer. The bottom electrode may include: a first doping region in contact with the dielectric layer; a main region spaced apart from the dielectric layer by the first doping region intervening therebetween; and a second doping region between the first doping region and the main region. Each of the first and second doping regions may include oxygen and a doping metal. In some embodiments, the second doping region may include nitrogen. The main region may be devoid of the doping metal. An amount (e.g., a concentration) of oxygen in the second doping region may be less than an amount (e.g., a concentration) of oxygen in the first doping region.

According to some example embodiments of the present inventive concepts, semiconductor devices may include a bottom electrode, a dielectric layer, and a top electrode that are sequentially stacked on a semiconductor substrate. The bottom electrode may include: a doping region adjacent to the dielectric layer; and a main region spaced apart from the dielectric layer. The doping region may include oxygen and a doping metal. In some embodiments, the doping region may include nitrogen. The main region may be devoid of the doping metal. An amount (e.g., a concentration) of oxygen in the doping region may decrease with decreasing distance from the main region.

According to some example embodiments of the present inventive concepts, methods of fabricating a semiconductor device may include: forming a bottom electrode on a substrate; supplying a source gas including a doping metal onto the bottom electrode to deposit a layer including the doping metal; supplying a nitrogen source gas onto the layer including the doping metal to form a doping layer on the bottom electrode, the doping layer including the metallic dopant and nitrogen; performing an annealing to form a first doping region in the bottom electrode, the first doping region including the metallic dopant diffused from the doping layer into the bottom electrode; removing the doping layer; forming a dielectric layer on the bottom electrode; and forming a top electrode on the dielectric layer.

According to some example embodiments of the present inventive concepts, semiconductor devices may include a capacitor; The capacitor may include a bottom electrode, a top electrode, and a dielectric layer between the bottom electrode and the top electrode. The bottom electrode may include a main region and the doping region. The doping region may include a first portion that is between the main region and the dielectric layer and contacts the dielectric layer and a second portion that is between the first portion and the main region. Each of the first portion and the second portion comprises oxygen and a metallic dopant, and a nitrogen concentration in the second portion is greater than a nitrogen concentration in the first portion.

BRIEF DESCRIPTION OF THE DRAWINGS

FIG. 1 illustrates a cross-sectional view of a semiconductor device according to some example embodiments of the present inventive concepts.

DETAILED DESCRIPTION

Figure 2A:
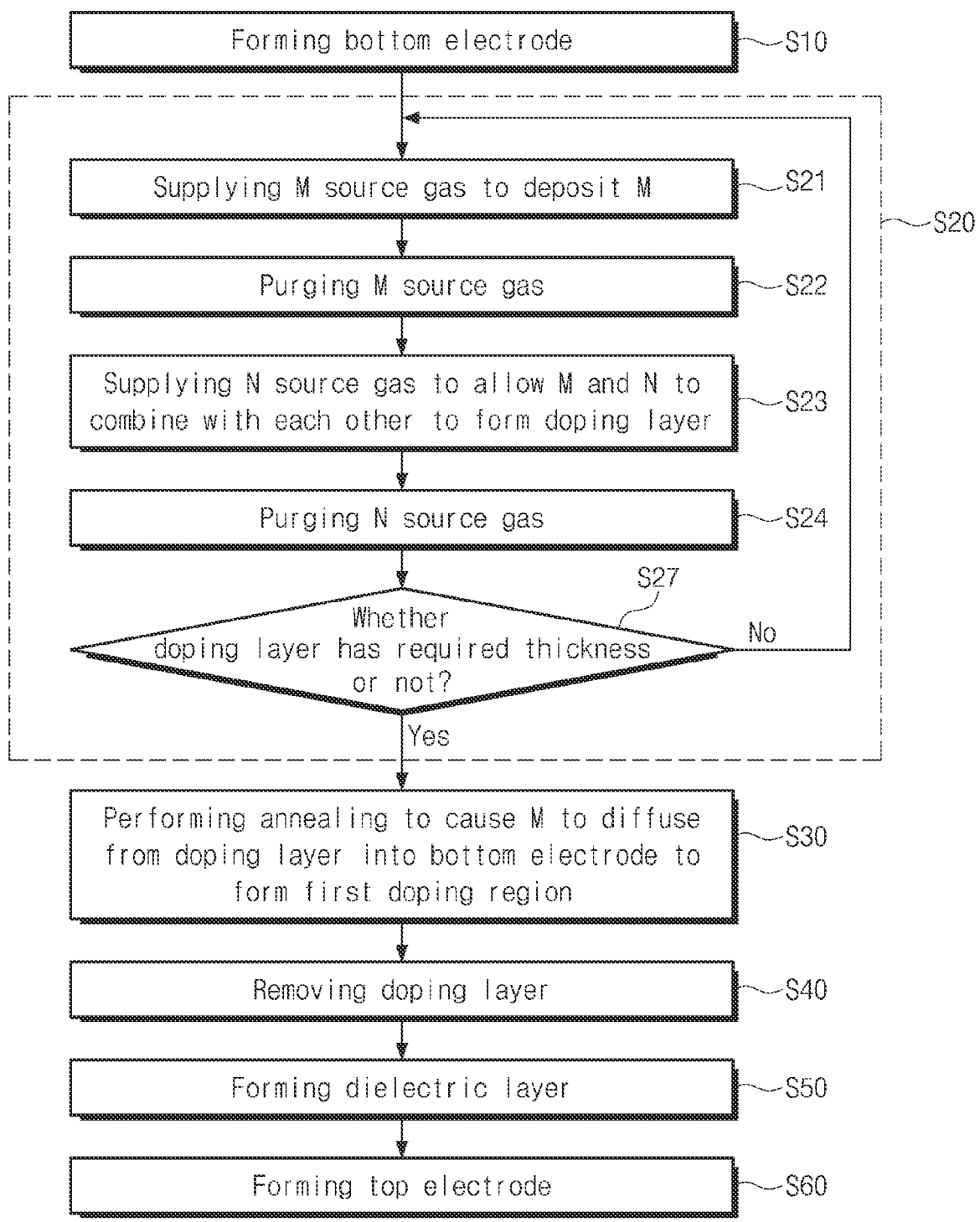
FIGS. 2A and 2B are flow charts of a method of fabricating a semiconductor device according to some example embodiments of the present inventive concepts.

Some example embodiments of the present inventive concepts will now be described in detail with reference to the accompanying drawings to aid in clearly explaining the present inventive concepts.

FIG. 1 illustrates a cross-sectional view of a semiconductor device according to some example embodiments of the present inventive concepts.

Referring to FIG. 1, a lower layer 1 may be provided. The lower layer 1 may be a semiconductor layer, a dielectric layer, and/or a conductive layer. The lower layer 1 may include, for example, a semiconductor substrate, an interlayer dielectric layer, and/or a contact plug. A capacitor CAP may be provided on the lower layer 1. The capacitor CAP may include a bottom electrode BE, a dielectric layer DL, and a top electrode TE that are sequentially stacked on the lower layer 1. The bottom electrode BE may have a first surface BES1 in contact with the dielectric layer DL and a second surface BES2 in contact with the lower layer 1. As used herein the term "and/or" includes any and all combinations of one or more of the associated listed items.

The bottom electrode BE may include a main region 3 spaced apart from the dielectric layer DL, a first doping region 5 between the main region 3 and the dielectric layer DL, and a second doping region 7 between the first doping region 5 and the dielectric layer DL. The second doping region 7 may contact the dielectric layer DL. The main region 3 may mostly occupy the bottom electrode BE. More than half of the bottom electrode BE may comprise the main region 3. A sum DT1 of thicknesses of the first and second doping regions 5 and 7 may range from about 1 Å to about 10 Å.

The first and second doping regions 5 and 7 may each include a doping metal M. The main region 3 may exclude the doping metal M. The main region 3 may be devoid of the doping metal M. The doping metal M may include, for example, a transition metal and/or a V-group metal. The transition metal may be, for example, vanadium (V), niobium (Nb), tantalum (Ta), molybdenum (Mo), and/or chromium (Cr). The V-group metal may be, for example, antimony (Sb) and/or arsenic (As). As used herein, the term "doping metal" may refer to metallic dopant. Further, as used herein, "a region X is devoid of an element Y" (or similar language) may mean that an amount of the element Y in the region X is very small such that the element Y may not be detected in the region X.

The main region 3 and the first doping region 5 may include nitrogen (N). The second doping region 7 may exclude nitrogen. The second doping region 7 may be devoid of nitrogen. An average amount of nitrogen in the main region 3 may be greater than an average amount of nitrogen in the first doping region 5. The main region 3, the first doping region 5, and the second doping region 7 may all include oxygen (O). An amount of oxygen may decrease as approaching the second surface BES2 from the first surface BES1. An average amount of oxygen in the first doping region 5 may be less than an average amount of oxygen in the second doping region 7 and greater than an average amount of oxygen in the main region 3. The term "amount" as used herein may be interchangeable with "concentration." As used herein, a concentration may refer to an atomic concentration.

The main region 3 may include a conductive layer. For example, the main region 3 may include titanium nitride. The second doping region 7 may include titanium oxide including (e.g., being doped with) a doping metal. The first doping region 5 may include titanium oxynitride including (e.g., being doped with) a doping metal.

The dielectric layer DL may include an insulating layer. The dielectric layer DL may include a single or multiple layer(s) formed of a metal oxide layer, such as a hafnium oxide layer, an aluminum oxide layer, and/or a zirconium oxide layer. The top electrode TE may include a conductive layer. The top electrode TE may include, for example, a metal-containing layer, such as a titanium nitride layer. The top electrode TE may further include a polysilicon layer (e.g., an impurity-doped polysilicon layer) and/or a silicon-germanium layer.

For a semiconductor device according to the present inventive concepts, because the sum DT1 of thicknesses of the first and second doping regions 5 and 7 has a small value of about 1 Å to about 10 Å, the bottom electrode BE may have a small electrical resistance. In some embodiments, a thickness of the main region 3 may be at least two times the sum DT1 of thicknesses of the first and second doping regions 5 and 7 as illustrated in FIG. 1, and thus the first and second doping regions 5 and 7 may not affect (e.g., may not increase) the electrical resistance of the bottom electrode BE significantly. Therefore, the capacitor CAP may increase in capacitance. In addition, because the first and second doping regions 5 and 7 include the doping metal M, a depletion region may reduce and resistance of the bottom electrode BE may decrease, with the result that the capacitor CAP may increase in capacitance. Moreover, the semiconductor device according to the present inventive concepts may have less defects, such as SBD (storage node bridge defect), and thus may increase in reliability.

Figure 2B:
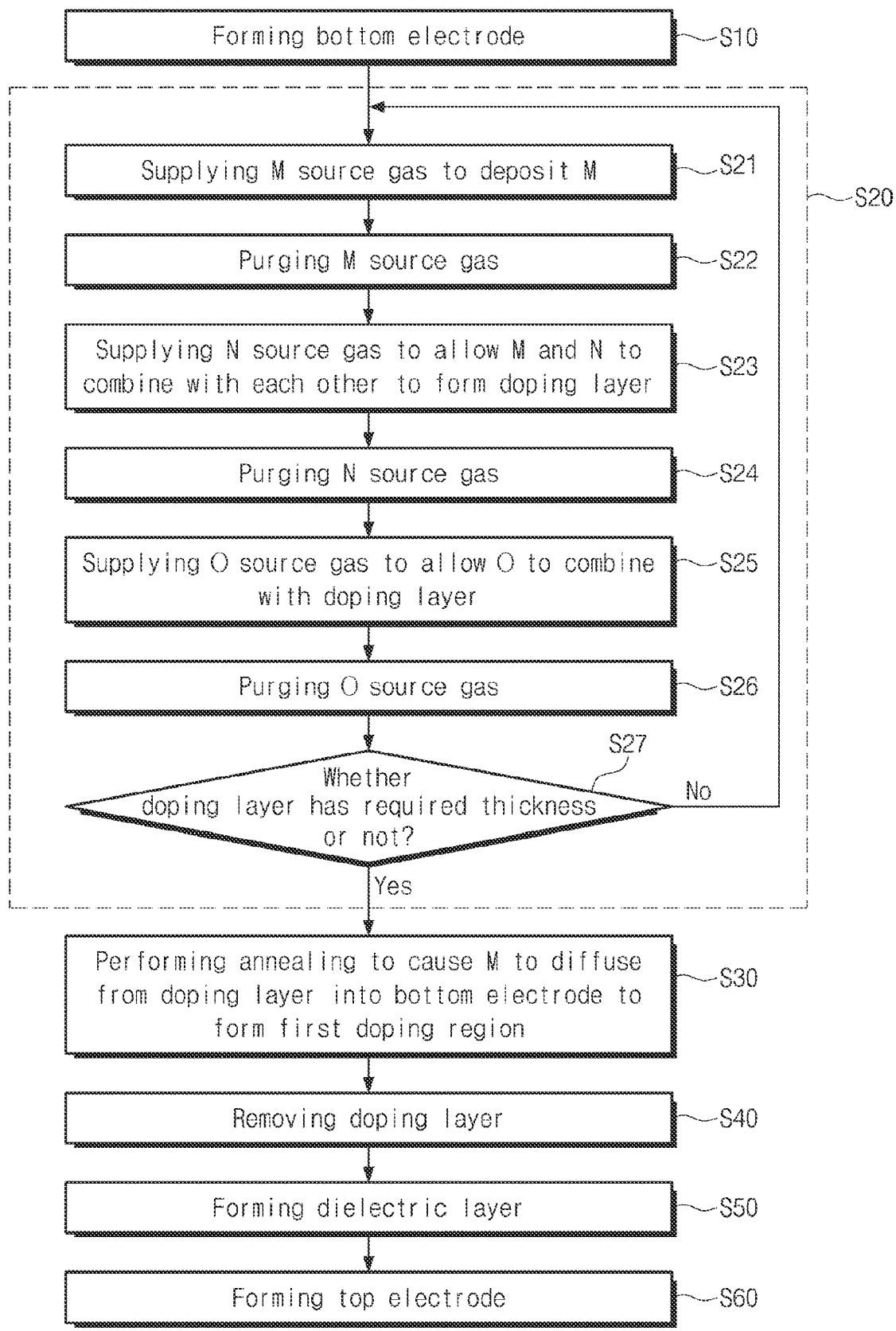

FIGS. 2A and 2B are flow charts of a method of fabricating a semiconductor device according to some example embodiments of the present inventive concepts. FIGS. 3A to 3D illustrate cross-sectional views showing a method of fabricating a semiconductor device according to some example embodiments of the present inventive concepts.

Figure 3A:
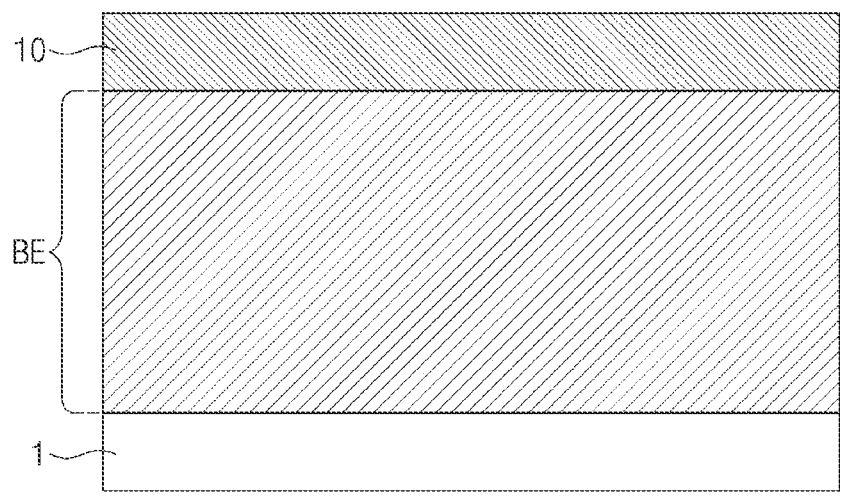
FIGS. 3A to 3D illustrate cross-sectional views showing a method of fabricating a semiconductor device according to some example embodiments of the present inventive concepts.

Referring to FIGS. 2A and 3A, a bottom electrode BE may be formed on a lower layer 1 (step S10). For example, the bottom electrode BE may include a titanium nitride layer formed by performing a deposition process, such chemical vapor deposition (CVD), atomic layer deposition (ALD), and/or physical vapor deposition (PVD). A doping layer 10 may be formed on the bottom electrode BE (step S20). In some embodiments, the formation of the doping layer 10 may be performed as follows.

Referring to FIG. 2A, a source gas for a doping metal M may be supplied such that the doping metal M may be deposited on the bottom electrode BE (step S21). Therefore, a thin layer including the doping metal M (e.g., a single-atomic-thick doping metal M) may be deposited. The doping metal M may include, for example, a transition metal and/or a V-group metal. The transition metal may be, for example, V, Nb, Ta, Mo, and/or Cr. The V-group metal may be, for example, Sb and/or As. The source gas of the doping metal M may be or may include a precursor gas of the doping metal M. A remaining portion of the source gas, which is not reacted to form the layer of the doping metal M may be purged (step S22). Afterwards, a nitrogen (N) source gas may be supplied such that the doping metal M and the nitrogen (N) may combine with each other to form a doping layer 10 (step S23). The nitrogen source gas may be or may include, for example, $NH_3$ and $N_2H_4$. The doping layer 10 may include elements of the doping metal M and elements of nitrogen (N). The doping layer 10 may be a single-atomic-thick layer including metal (e.g., metallic element) and nitrogen. A remaining portion of the nitrogen source gas, which is not combined with the doping metal M may be purged (step S24). It may be determined whether the doping layer 10 has a predetermined thickness (e.g., a required thickness) (step S27). When the doping layer 10 does not have the predetermined thickness, the steps S21 to S24 may be performed again. The steps S21 to S24 may be repeatedly executed until the doping layer 10 has the predetermined thickness.

In some embodiments, referring to FIG. 2B, after the step S24 and before the step S27, an oxygen (O) source gas may be supplied to cause oxygen (O) to combine with the doping layer 10 (step S25). The oxygen source gas may be or may include, for example, $O_2$, $O_3$, and/or $H_2O$. Oxygen elements may combine with the doping layer 10 that includes the doping metal M and the nitrogen (N). In this case, the doping layer 10 may be a single-atomic-thick layer including metal, nitrogen, and oxygen. A remaining portion of the oxygen source gas, which is not combined with the doping layer 10 may be purged (step S26). The steps S21 to S26 may be repeatedly performed until the doping layer 10 has the predetermined thickness.

In some embodiments, the step S23 and the step S25 may be performed at the same time. For example, the oxygen source gas and the nitrogen source gas may be supplied concurrently. As used herein, "two gases are supplied concurrently" may mean that the two gases are supplied at approximately (but not necessarily exactly) the same time.

Figure 3B:
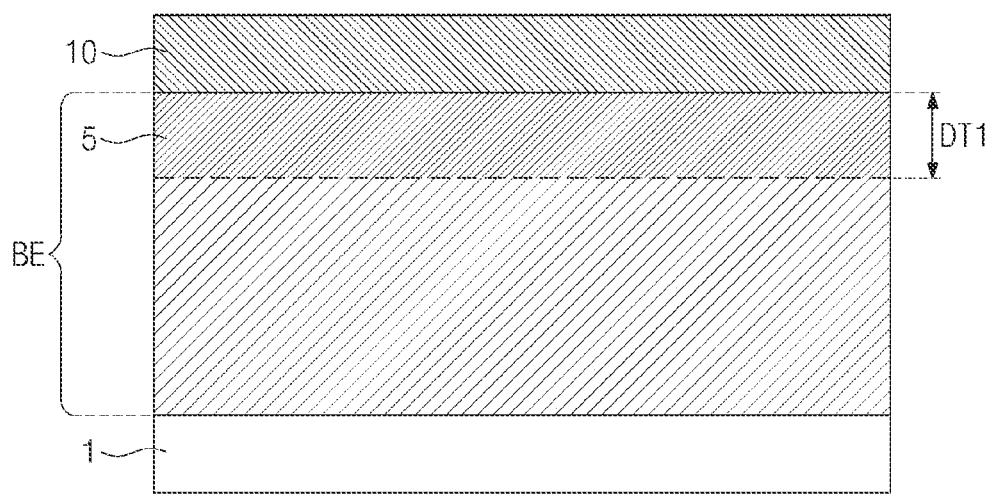

Referring to FIGS. 2A, 2B, and 3B, when the doping layer 10 has the predetermined thickness, an annealing process may be performed such that the doping metal M in the doping layer 10 may diffuse into the bottom electrode BE, with the result that a first doping region 5 may be formed (step S30). The annealing process may be performed at a temperature between about 100° C. to about 500° C. The first doping region 5 may have a thickness (or, depth DT1) of about 1 Å to about 10 Å. Nitrogen in the doping layer 10 may seldom diffuse into the first doping region 5. In addition, nitrogen in the doping layer 10 may inhibit or block diffusion of oxygen from the doping layer 10 into the first doping region 5. Therefore, the first doping layer 10 may have a relatively small amount of oxygen. A main region 3 may be defined to refer to a section below the first doping region 5.

Figure 3C:
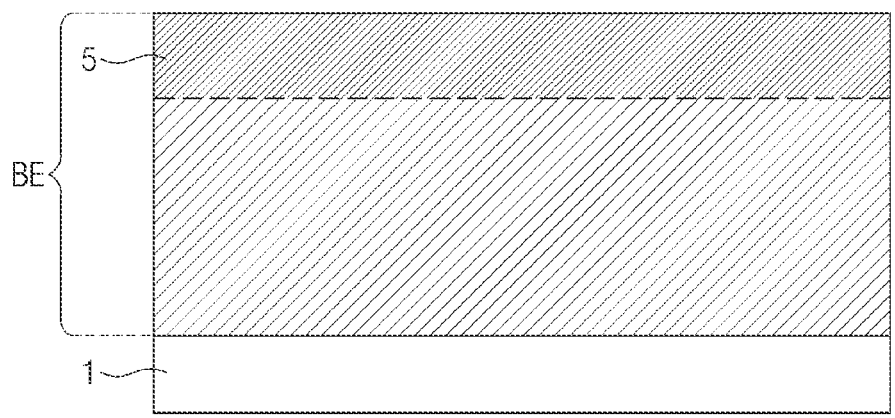

Referring to FIGS. 2A, 2B, and 3C, the doping layer 10 may be removed (step S40). The step S40 may be performed which uses, for example, a halogen-containing etchant, such as hydrofluoric acid and/or hydrochloric acid. The removal of the doping layer 10 may expose a surface of the first doping region 5. When the doping layer 10 is not removed, the bottom electrode BE including the doping layer 10 may increase in electrical resistance, which may result in a reduction in capacitance. The doping layer 10 may increase electrical resistance of the bottom electrode BE, and thus the doping layer 10 may be removed.

Figure 3D:
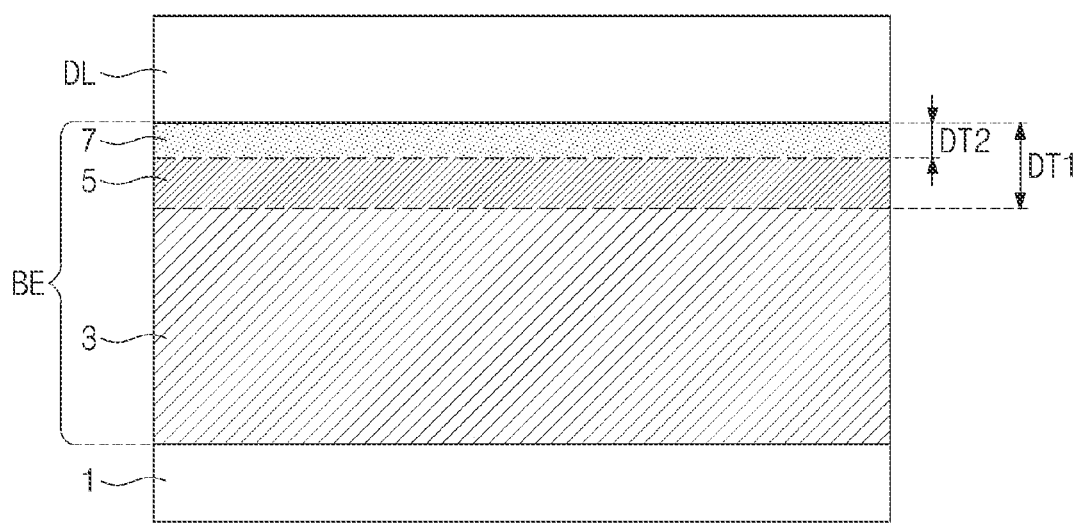

Referring to FIGS. 2A, 2B, and 3D, a dielectric layer DL may be formed on the bottom electrode BE (step S50). The step S50 may be performed such that a deposition process (e.g., chemical vapor deposition (CVD) and/or atomic layer deposition (ALD)) may be used to deposit a metal oxide layer. In this case, an oxygen source gas may be supplied to deposit the metal oxide layer, and the oxygen source gas may cause the surface of the first doping region 5 to partially oxidize into a second doping region 7. The second doping region 7 may exclude nitrogen. The second doping region 7 may have a thickness (or, depth DT2) less than the thickness of the first doping region 5. Nitrogen in the first doping region 5 may inhibit or block diffusion of oxygen from the second doping region 7 into the main region 3. Therefore, in the bottom electrode BE, it may be possible to reduce the thickness DT1 of the doping regions 5 and 7 whose oxygen amount is greater than that of the main region 3.

Subsequently, referring to FIGS. 2A, 2B, and 1, a top electrode TE may be formed on the dielectric layer DL (step S60). A semiconductor device may thus be fabricated as shown in FIG. 1.

In a method of fabricating a semiconductor device according to the present inventive concepts, the nitrogen source gas supplied in the step S23 may reduce, minimize or prevent excessive oxidation of the bottom electrode BE, and accordingly defects of the bottom electrodes BE may be reduced, minimized or prevented. Those defects may include, for example, storage node bridge defect (SBD) occurring when the bottom electrodes BE bend to contact each other. As a result, process failure may be reduced to increase a yield.

Moreover, when a dielectric layer is directly formed on a bottom electrode without forming a doping region of the doping metal M, an oxygen source gas supplied for forming the dielectric layer may cause that the bottom electrode is excessively oxidized to induce defects, such as SBD. Furthermore, the oxygen source gas and a metallic element (e.g., titanium) of the bottom electrode may react with each other to form a titanium oxide layer. Because the titanium oxide layer has semiconductor properties, when the bottom electrode is supplied with voltage, the titanium oxide layer may have therein a depletion region to cause a loss of capacitance. In contrast, according to the present inventive concepts, the doping regions 5 and 7 of the doping metal M may be formed such that the depletion region may be reduced to increase capacitance.

Figure 4:
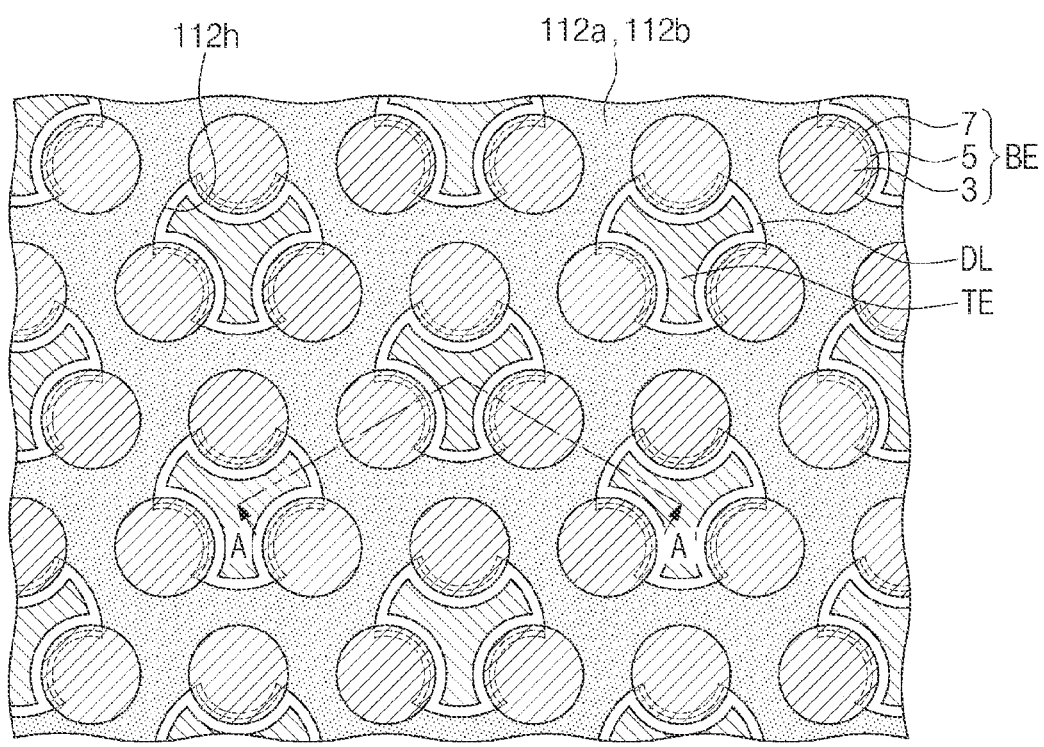
FIG. 4 illustrates a plan view of a semiconductor device according to some example embodiments of the present inventive concepts.
Figure 5:
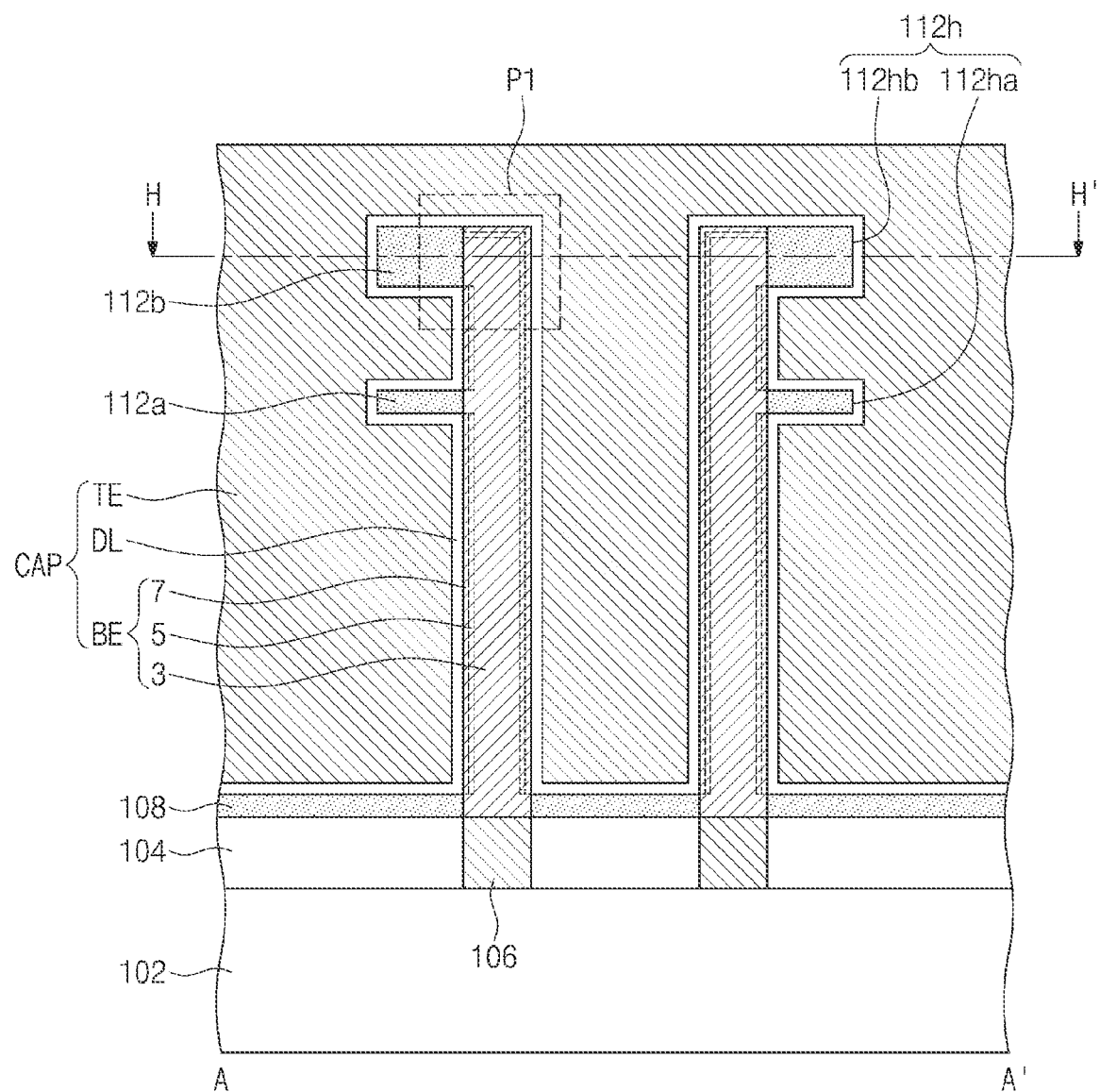
FIG. 5 illustrates a cross-sectional view taken along a line A-A' of FIG. 4.
Figure 6:
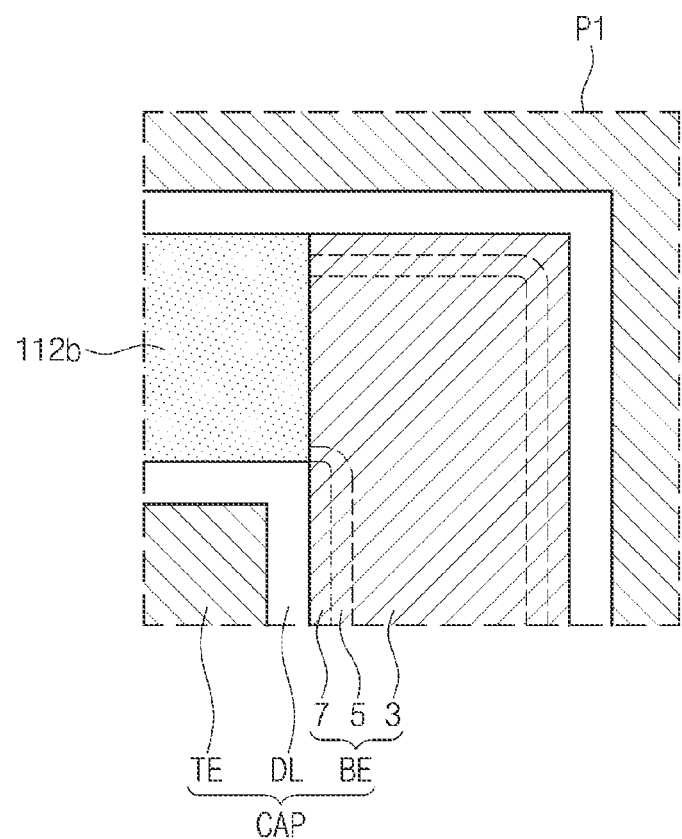
FIG. 6 illustrates an enlarged view of a section P1 of FIG. 5.

FIG. 4 illustrates a plan view of a semiconductor device according to some example embodiments of the present inventive concepts. FIG. 5 illustrates a cross-sectional view taken along a line A-A' of FIG. 4. FIG. 6 illustrates an enlarged view of a section P1 of FIG. 5. FIG. 4 may correspond to a plan view taken along a line H-H' of FIG. 5.

Referring to FIGS. 4 to 6, a semiconductor substrate 102 may be provided. The semiconductor substrate 102 may be, for example, a single-crystalline silicon substrate. An interlayer dielectric layer 104 may be disposed on the semiconductor substrate 102. The interlayer dielectric layer 104 may be formed of, for example, a silicon oxide layer. The interlayer dielectric layer 104 may have therein a plurality of storage node contacts 106 that penetrate the interlayer dielectric layer 104 and have electrical connections with the semiconductor substrate 102. The storage node contacts 106 may include, for example, a polysilicon pattern (e.g., an impurity-doped polysilicon pattern), a titanium nitride layer, and/or a tungsten layer.

Although not shown, the semiconductor substrate 102 may be provided thereon with a device isolation layer that defines active regions. Word lines may be (e.g., be buried) in the semiconductor substrate 102. The word line may be insulated from the semiconductor substrate 102 though a gate dielectric layer and a capping pattern. Source/drain regions may be provided to include impurity regions disposed in the semiconductor substrate 102 on opposite sides of each of the word lines, respectively. The impurity regions on one side of each of the word lines may be electrically connected to corresponding bit lines. The storage node contacts 106 may be electrically connected to the impurity regions on an opposite side of each of the word lines.

An etch stop layer 108 may be disposed on the interlayer dielectric layer 104. The etch stop layer 108 may be formed of a single or multiple layer including, for example, a silicon nitride layer, a silicon boronitride layer (SiBN), and/or a silicon carbonitride layer (SiCN). Bottom electrodes BE may penetrate the etch stop layer 108 and may correspondingly contact the storage node contacts 106. The bottom electrodes BE may each have a plug shape with a circular cross-section. The bottom electrodes BE may be disposed to constitute a honeycomb shape when viewed in plan. For example, sixth bottom electrodes BE may be arranged to constitute a hexagonal shape around a single bottom surface BE, as illustrated in FIG. 4. The bottom electrodes BE may include, for example, a polysilicon layer (e.g., an impurity-doped polysilicon layer), a metal layer, a metal oxide layer, and/or a metal nitride layer. For example, the bottom electrodes BE may include a titanium nitride layer.

The bottom electrodes BE may each have a lateral surface (e.g., a side surface or wall) in contact with a first support pattern 112a and a second support pattern 112b. The first support pattern 112a and the second support pattern 112b may be spaced apart from each other. The second support pattern 112b may be positioned above the first support pattern 112a. The second support pattern 112b may have a top surface coplanar with those of the bottom electrodes BE. The first support pattern 112a and the second support pattern 112b may be formed of a single or multiple layer(s) including a silicon nitride (SiN) layer, a silicon boronitride layer (SiBN) layer, and/or a silicon carbonitride (SiCN) layer.

The first support pattern 112a and the second support pattern 112b may have different thicknesses from each other. For example, the second support pattern 112b may be thicker than the first support pattern 112a as illustrated in FIG. 5. The first support pattern 112a and the second support pattern 112b may have their support holes 112h. The first support pattern 112a may have first support holes 112ha. The second support pattern 112b may have second support holes 112hb. The first support holes 1/2ha may vertically overlap the second support holes 112hb. The support hole 112h may expose sidewalls of three bottom electrodes BE adjacent thereto. In some embodiments, each of the first support holes 112ha may be aligned with a respective one of the second support holes 12hb as illustrated in FIG. 5. As used herein, "an element A vertically (or horizontally) overlapping an element B" (or similar language) may mean that at least one vertical (or horizontal) line intersecting both the elements A and B exists.

The first support patterns 112a, the second support patterns 112b, and surfaces of the bottom electrodes BE may be conformally covered with a dielectric layer DL. The dielectric layer DL may have a uniform thickness along surfaces of the first support patterns 112a and the second support patterns 112b and the surfaces of the bottom electrodes BE. A top electrode TE may be positioned on the dielectric layer DL. The dielectric layer DL may include, for example, a silicon oxide layer and/or a metal oxide layer whose dielectric constant is greater than that of a silicon oxide layer (e.g., silicon dioxide). For example, the dielectric layer DL may be formed of a single or multiple layer including a hafnium oxide layer, an aluminum oxide layer, and/or a zirconium oxide layer. The top electrode TE may be formed to have a single-layered or multi-layered structure including a titanium nitride layer, an impurity-doped polysilicon layer, and/or an impurity-doped silicon-germanium layer. The bottom electrodes BE, the dielectric layer DL, and the top electrode TE may constitute a capacitor CAP. As used herein, "an element A covering an element B" (or similar language) may mean that the element A extends on and overlaps the element B but does not necessarily mean that the element A covers the element B entirely.

The bottom electrode BE may include a main region 3, a first doping region 5, and a second doping region 7 that are discussed with reference to FIG. 1. Most of the first and second doping regions 5 and 7 may be disposed adjacent to a surface of the bottom electrode BE, which surface is in contact with the dielectric layer DL. In some embodiments, the first and second doping regions 5 and 7 may not be formed in portions of the bottom electrode BE, which are in contact with etch stop layer 108, the first support pattern 112a, the second support pattern 112b, as illustrated in FIG. 5. As shown in FIGS. 5 and 6, portions of the first and second doping regions 5 and 7 may contact sidewalls of the etch stop layer 108, the first support pattern 112a, and the second support pattern 112b, and most of the sidewalls of the first and second support patterns 112a and 112b may contact the main region 3. Each of the first and second doping regions 5 and 7 may have an arc shape when viewed in plan as shown in FIG. 4. Other configurations may be the same as or similar to those discussed with reference to FIG. 1.

Figure 7A:
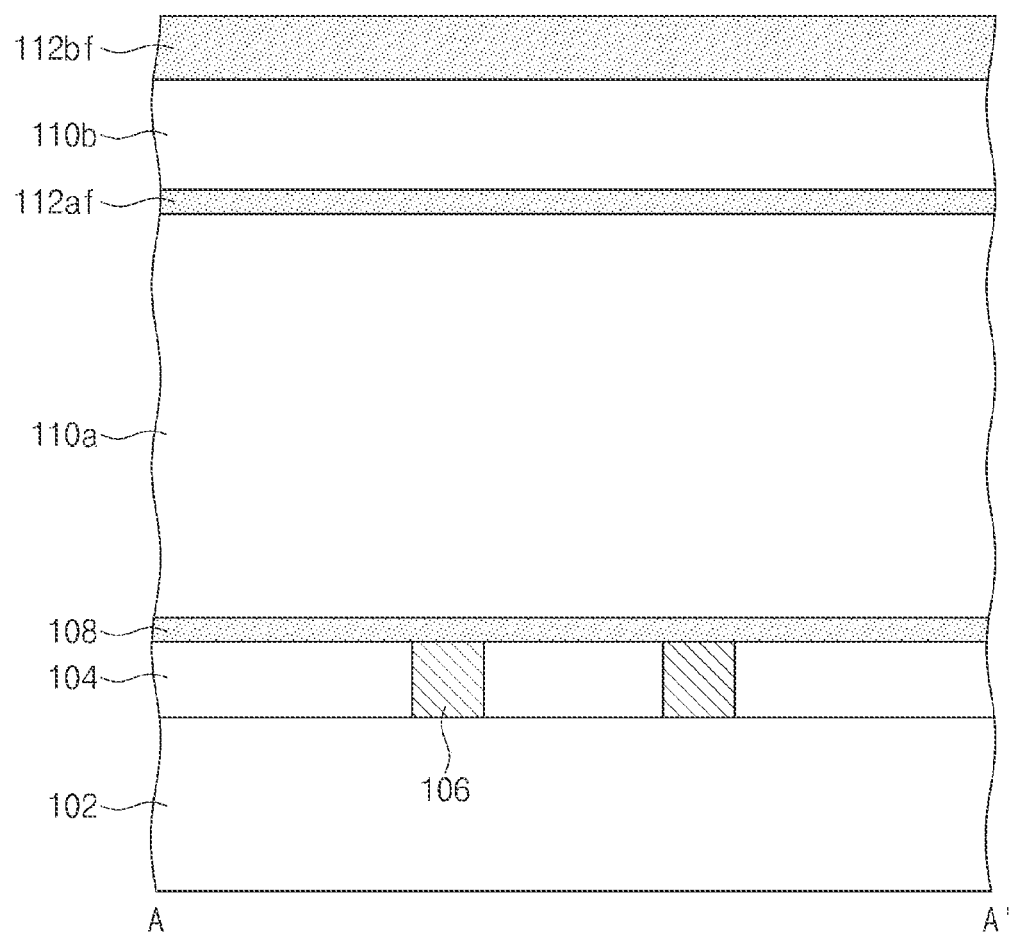
FIGS. 7A, 7B, 8B, 9A, 9B, and 9C illustrate cross-sectional views showing a method of fabricating a semiconductor device having the cross-section of FIG. 5.
Figure 7B:
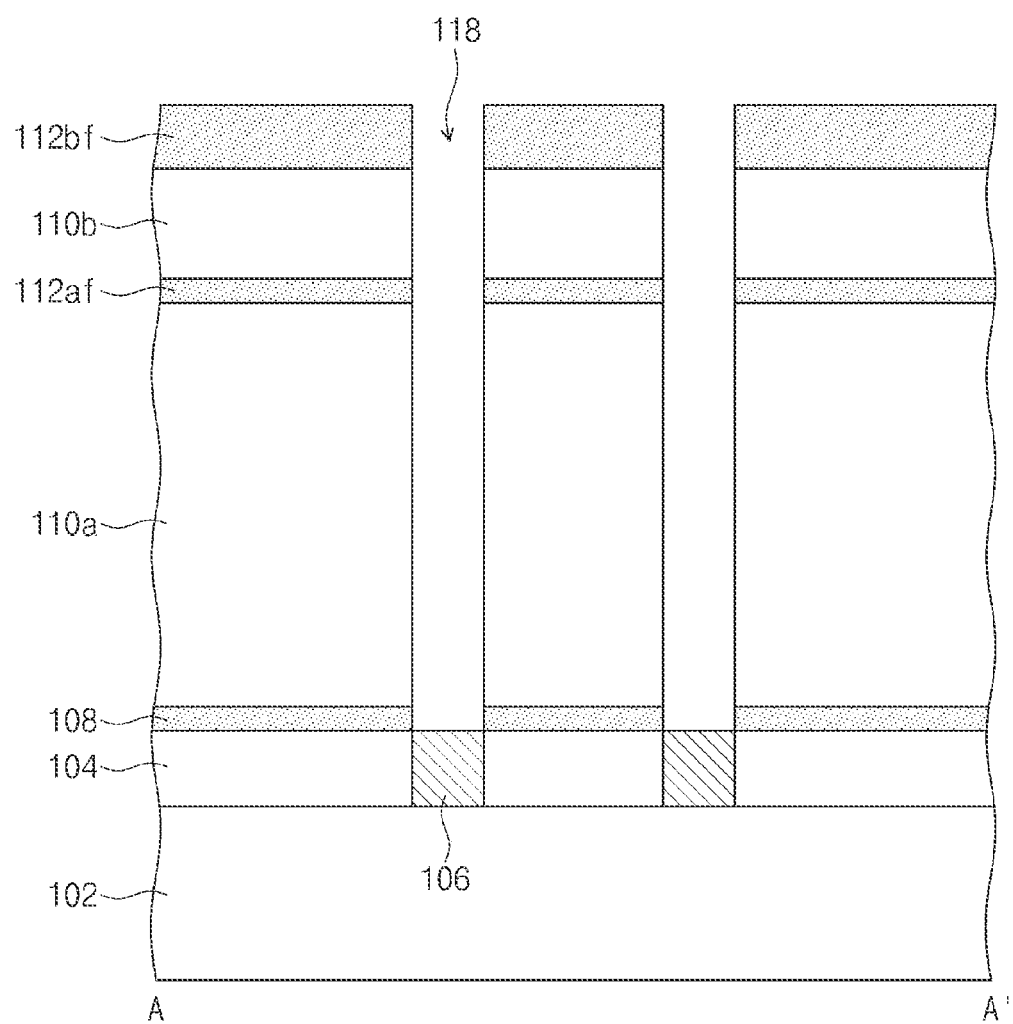
Figure 8A:
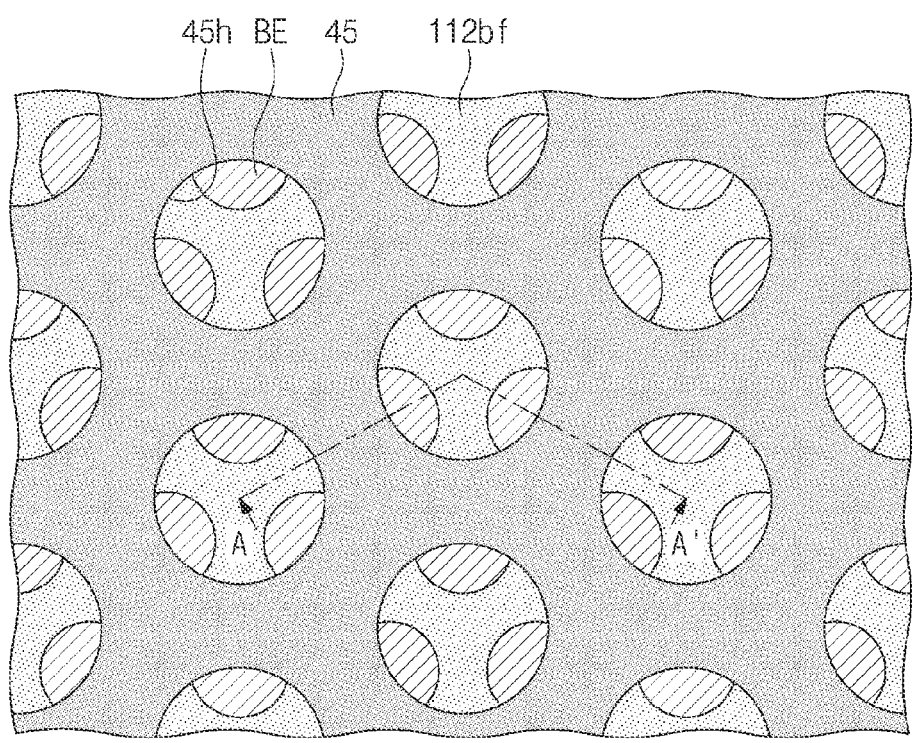
FIG. 8A illustrates a plan view showing a method of fabricating a semiconductor device having the plan view of FIG. 4.
Figure 8B:
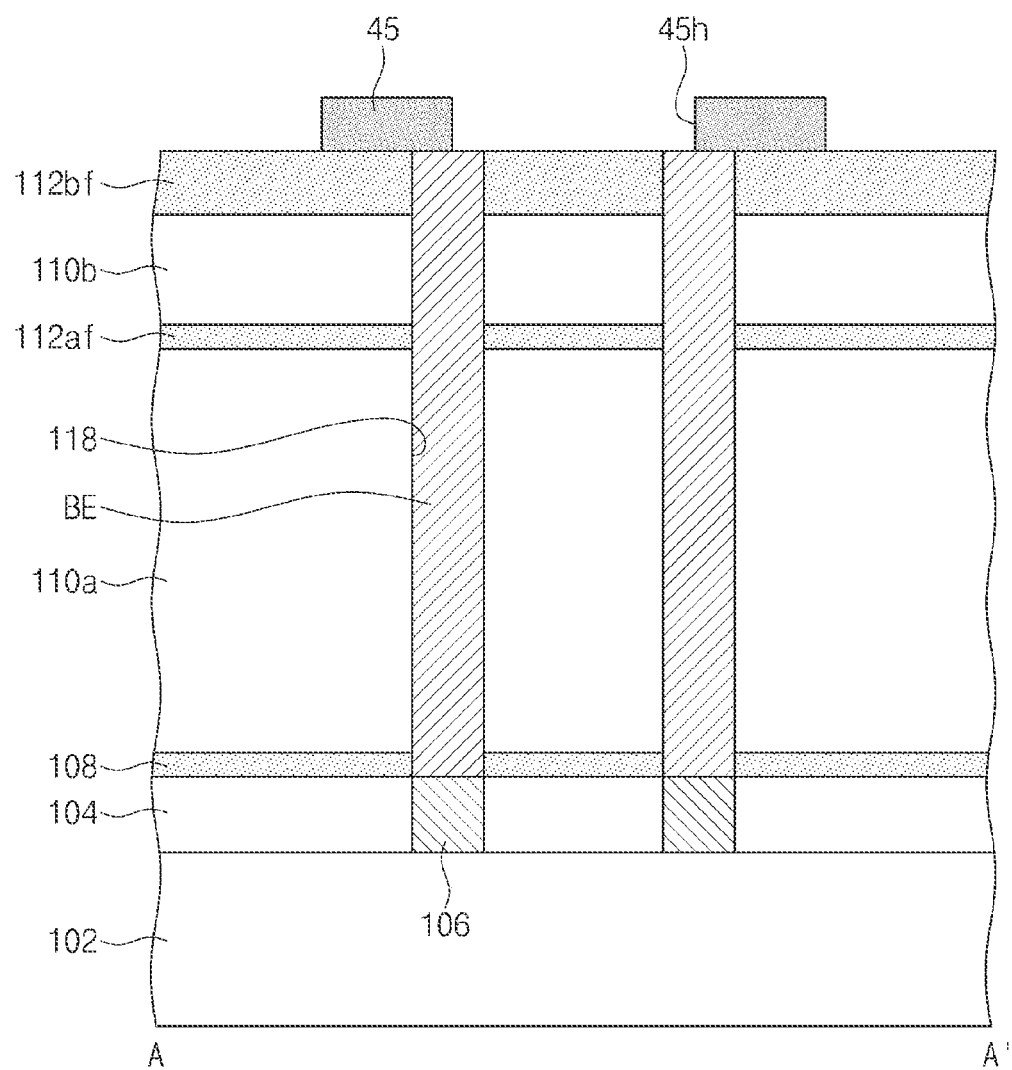

FIGS. 7A, 7B, 8B, 9A, 9B, and 9C illustrate cross-sectional views showing a method of fabricating a semiconductor device having the cross-section of FIG. 5. FIG. 8A illustrates a plan view showing a method of fabricating a semiconductor device having the plan view of FIG. 4. FIG. 8B may correspond to a cross-section taken along line A-A' of FIG. 8A.

Referring to FIG. 7A, an interlayer dielectric layer 104 may be formed on a semiconductor substrate 102. Storage node contacts 106 may be formed in the interlayer dielectric layer 104. An etch stop layer 108 may be formed on the interlayer dielectric layer 104 and the storage node contacts 106. A first mold layer 110a, a first support layer 112af, a second mold layer 110b, and a second support layer 112bf may be sequentially formed on the etch stop layer 108.

In some embodiments, the first support layer 112af and the second support layer 112bf may be formed of the same material. In some embodiments, the first mold layer 110a and the second mold layer 10b may include the same material, which material may have an etch selectivity with respect to the first support layer 112af and the second support layer 112bf. For example, the first mold layer 110a and the second mold layer 110b may be formed of a silicon oxide layer. The first support layer 112af and the second support layer 112bf may be formed of a single or multiple layer including a silicon nitride (SiN) layer, a silicon boronitride (SiBN) layer, and/or a silicon carbonitride (SiCN) layer. The first mold layer 110a may be thicker than the second mold layer 110b. The second support layer 112bf may be thicker than the first support layer 112af.

Referring to FIG. 7B, the second support layer 112bf, the second mold layer 110b, the first support layer 112af, the first mold layer 110a, and the etch stop layer 108 may be sequentially etched to form bottom electrode holes 118 that correspondingly expose the storage node contacts 106.

Referring to FIGS. 8A and 8B, on an entire surface of the semiconductor substrate 102, a conductive layer may be formed to fill the bottom electrode holes 118, and then etched back to form bottom electrodes BE in the bottom electrode holes 118, respectively. The second support layer 112bf may be exposed at a top surface thereof. A first mask pattern 45 may be formed on the second support layer 112bf. The first mask pattern 45 may include openings 45h that partially expose top surfaces of the bottom electrodes BE. For example, the openings 45h may each partially expose the top surfaces of three neighboring bottom electrodes BE and the top surface of the second support layer 112bf between the three neighboring bottom electrodes BE.

Figure 9A:
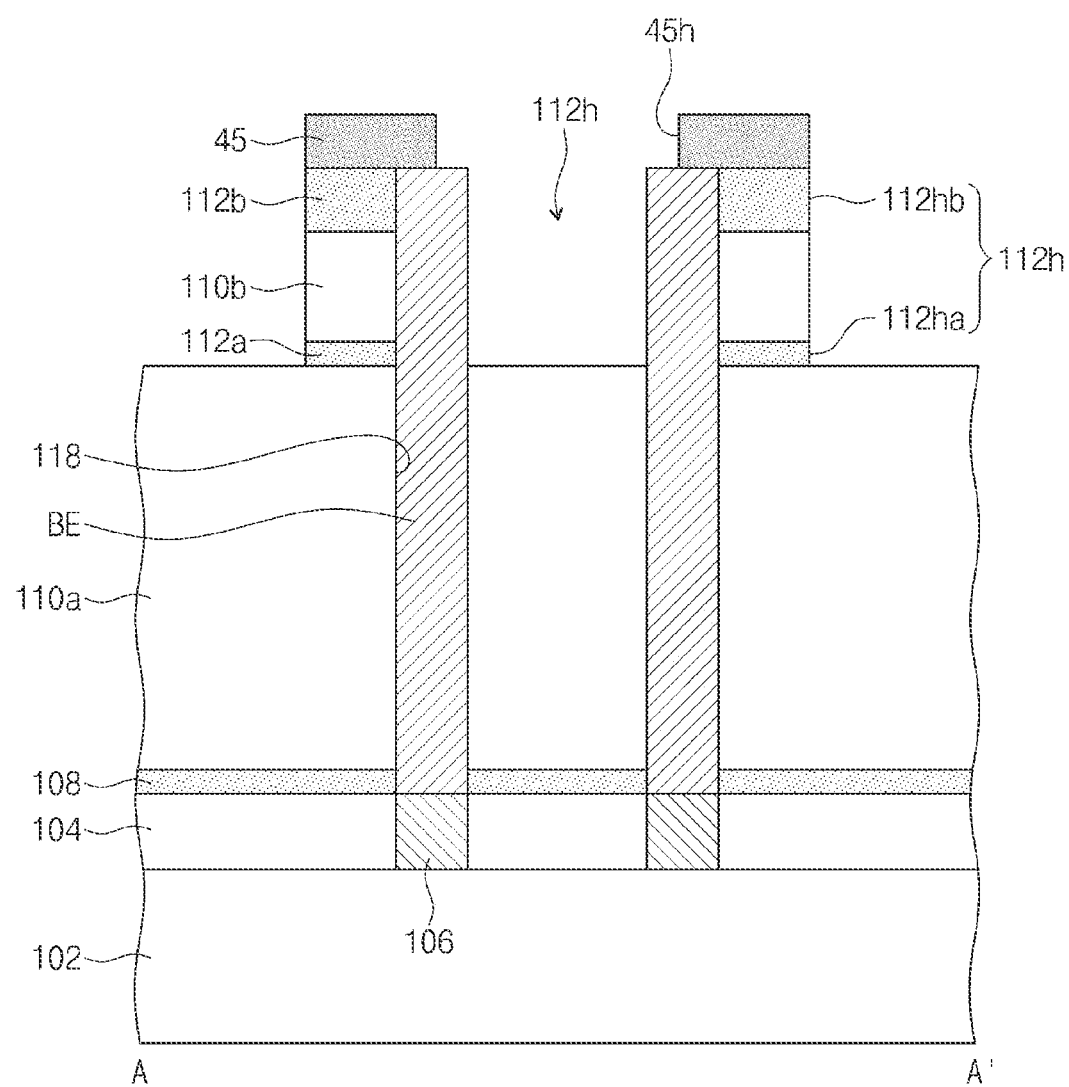

Referring to FIG. 9A, an etching process (e.g., an anisotropic etching process) may be performed in which the first mask pattern 45 is used as an etching mask to sequentially pattern the second support layer 112bf exposed to the openings 45h, the second mold layer 110b below the second support layer 112bf, and the first support layer 112af below the second mold layer 110b, thereby forming support holes 112h that expose a top surface of the first mold layer 110a. In this case, the first support layer 112af may be etched to form a first support pattern 112a that has first support holes 112ha. In addition, the second support layer 112bf may be etched to form a second support pattern 112b that has second support holes 112hb. The first support holes 112ha may vertically overlap corresponding second support holes 112hb and may have their forms and sizes identical or similar to those of the second support holes 112hb. Moreover, a sidewall of the second mold layer 110b may be exposed in this case.

Figure 9B:
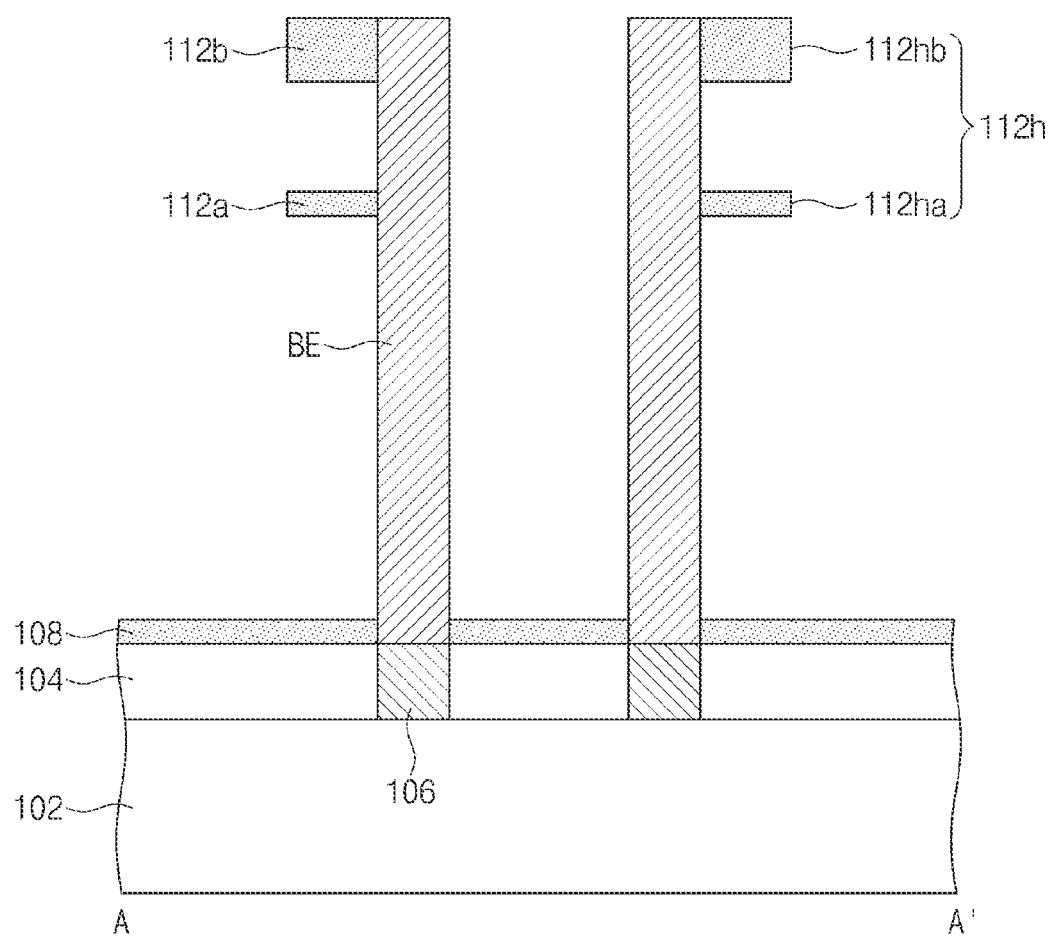

Referring to FIG. 9B, an isotropic etching process may be performed in which the first and second mold layers 110a and 110b exposed to the support holes 112h are removed to expose surfaces of the bottom electrodes BE. In this case, the etch stop layer 108 may be exposed at its top surface, and the first and second support patterns 112a and 112b may be exposed at their top, lateral, and bottom surfaces.

In some embodiments, an anisotropic process may be performed in which the second support layer 112bf is etched to form the second support pattern 112b including the second support hole 112hb, and then an isotropic etching process may be performed in which the second support hole 112hb is used to remove the second mold layer 110b. Afterwards, an anisotropic etching process may be performed in which the first support layer 112af is etched to form the first support pattern 112a including the first support hole 112ha, and an isotropic etching process may be performed in which the first support hole 112ha is used to remove the first mold layer 110a.

Figure 9C:
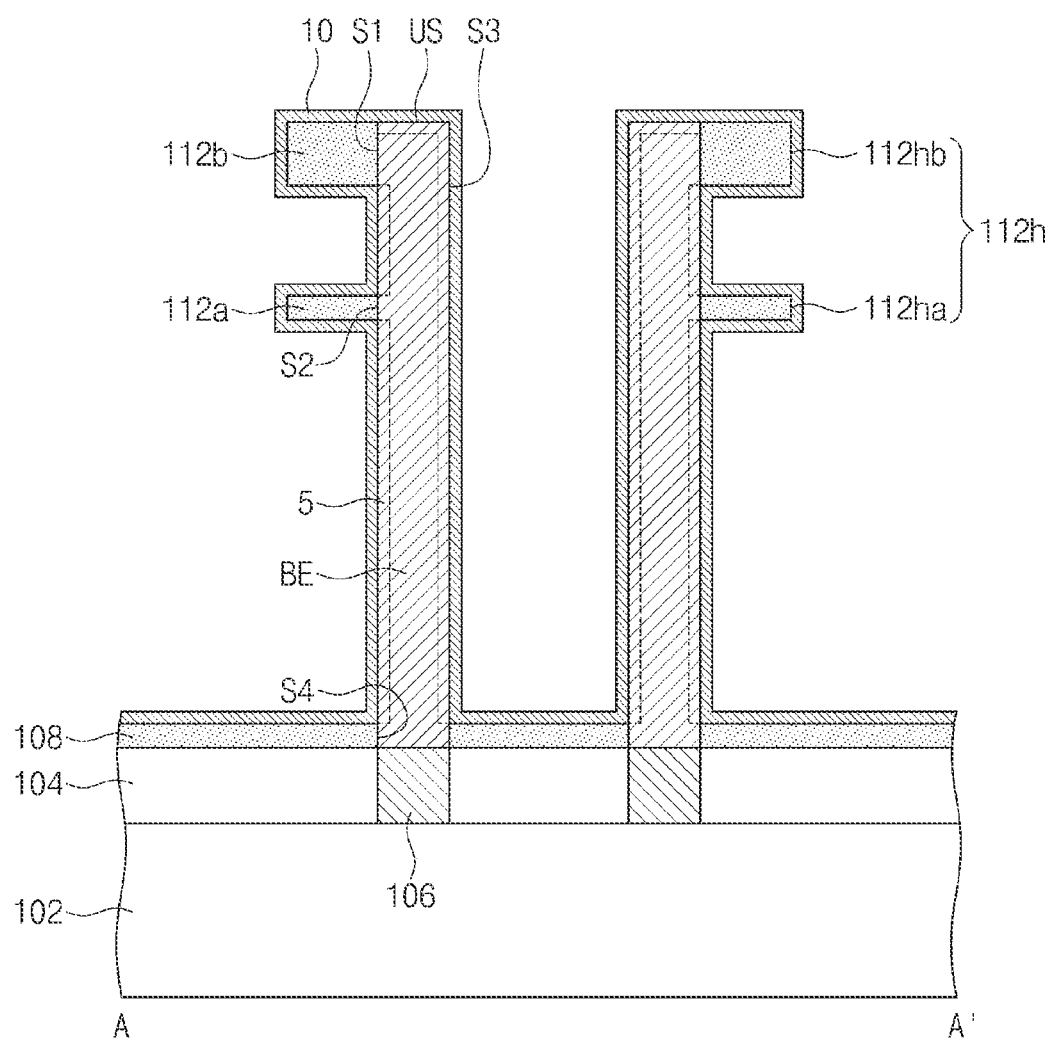

Referring to FIG. 9C, the processes discussed with reference to FIGS. 2A, 2B, and 3A to 3C may be performed to form first doping regions 5 in corresponding bottom electrodes BE. For example, a doping layer 10 may be conformally formed on a resultant structure of FIG. 9B, and then an annealing process may be performed to cause the doping metal M from diffusing from the doping layer 10 into the bottom electrodes BE, with the result that the first doping regions 5 may be formed. In this case, the doping metal M in the doping layer 10 may diffuse into neither the first support pattern 112a nor the second support pattern 112b. The bottom electrode BE may have a lateral surface whose first part S1 and a second part S2 are in contact with the first support pattern 112a and the second support pattern 112b, respectively, but are not in direct contact with the doping layer 10. In some embodiments, the first doping region 5 may be formed on neither the entire first part S1 nor the entire second part S2. In contrast, the doping metal M may diffuse through a top surface US of the bottom electrode BE and through a third part S3 at the lateral surface of the bottom electrode BE, which third part S3 is in direct contact with the doping layer 10, with the result that the first doping region 5 may be formed on the third part S3. The doping metal M in the doping layer 10 may not diffuse into the etch stop layer 108. The bottom surface of the bottom electrode BE may have a fourth part S4 in contact with the etch stop layer 108 and not in direct contact with the doping layer 10, with the result that the first doping region 5 may not be formed on the fourth part S4.

Referring back to FIGS. 9C and 5, after the first doping region 5 is formed, the doping layer 10 may be removed to expose the surface of the bottom electrode BE. A dielectric layer DL may be deposited. In this case, a second doping region 7 may be formed. A top electrode TE may be formed on the dielectric layer DL.

Figure 10:
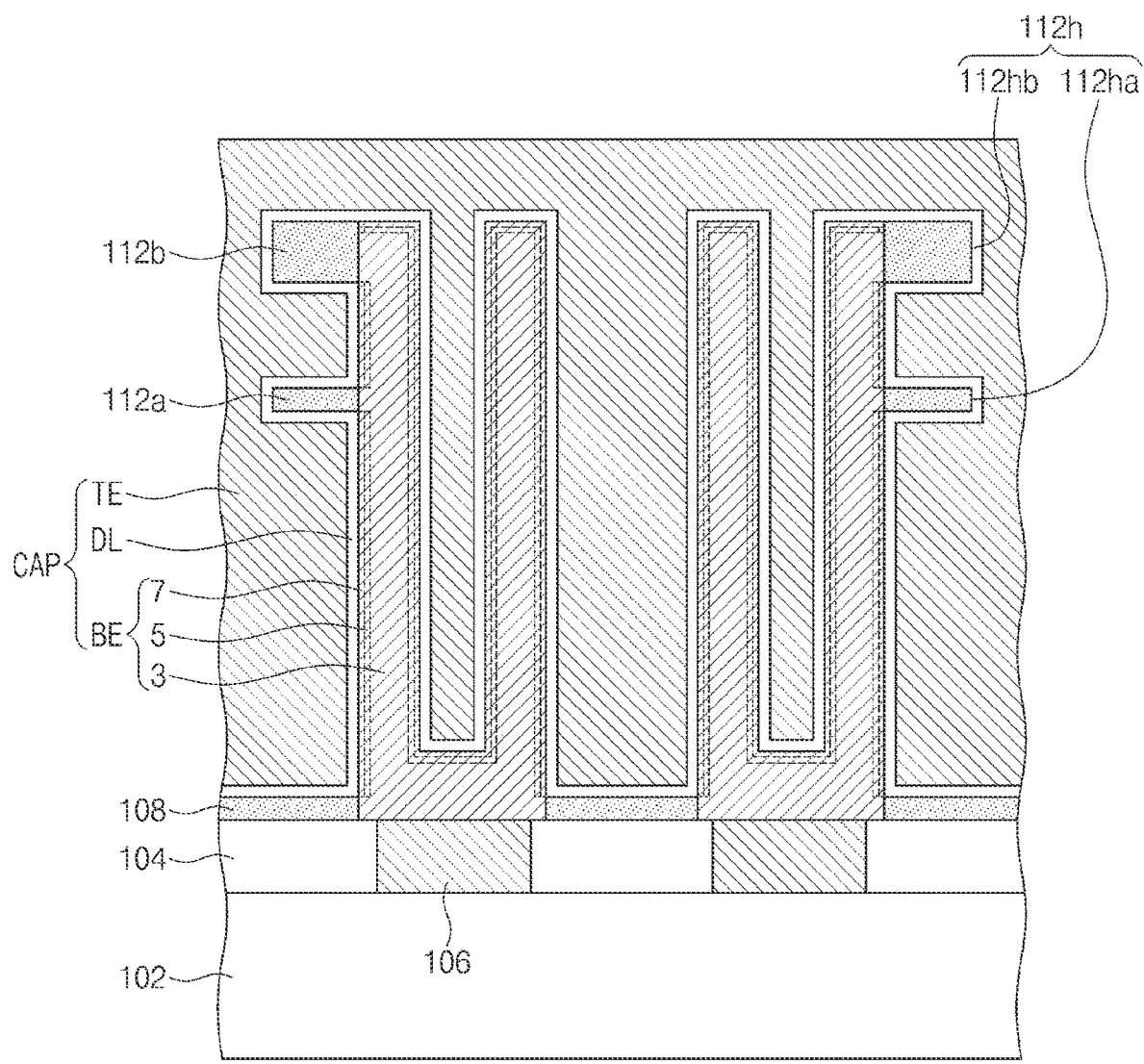
FIG. 10 illustrates a cross-sectional view of a semiconductor device according to some example embodiments of the present inventive concepts.

FIG. 10 illustrates a cross-sectional view of a semiconductor device according to some example embodiments of the present inventive concepts.

Referring to FIG. 10, a semiconductor device may be configured such that each of the bottom electrodes BE has a hollow cup or cylindrical shape. The first doping region 5 and the second doping region 7 may be formed adjacent to inner and outer sidewalls of the bottom electrode BE. Other components are the same as or similar to those discussed with reference to FIGS. 1, 5, and 6.

Figure 11:
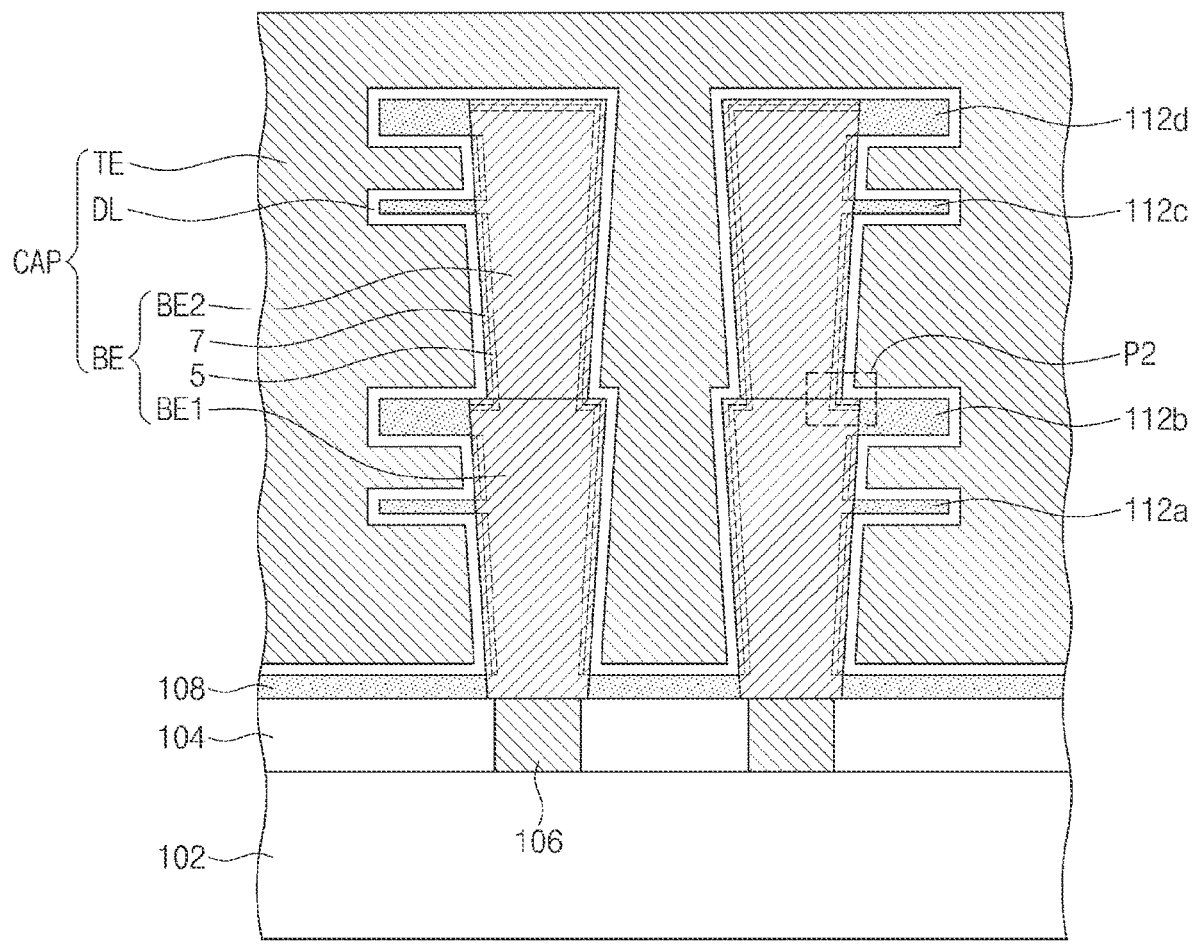
FIG. 11 illustrates a cross-sectional view of a semiconductor device according to some example embodiments of the present inventive concepts.
Figure 12:
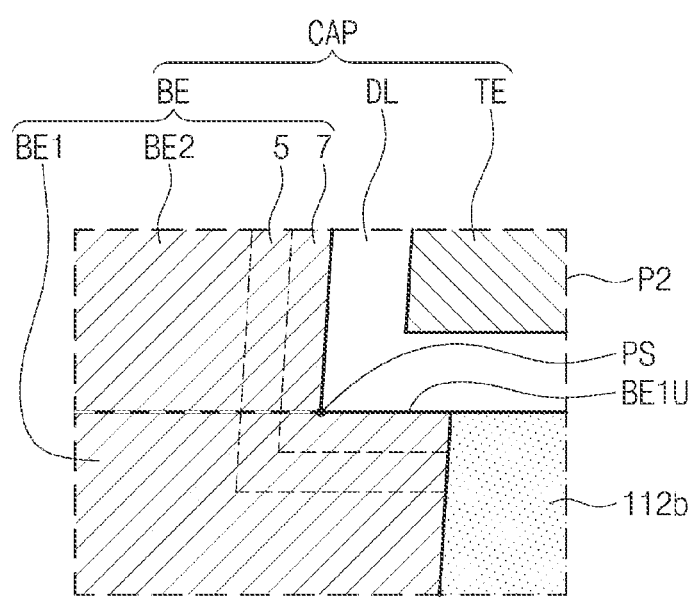
FIG. 12 illustrates an enlarged view of a section P2 of FIG. 11.

FIG. 11 illustrates a cross-sectional view of a semiconductor device according to some example embodiments of the present inventive concepts. FIG. 12 illustrates an enlarged view of a section P2 of FIG. 11.

Referring to FIGS. 11 and 12, each of the bottom electrodes BE may include a lower pillar BE1 and an upper pillar BE2 disposed on the lower pillar BEL. A boundary or interface may be present or absent between the lower pillar BE1 and the upper pillar BE2. In some embodiments, an interface between the lower pillar BE1 and the upper pillar BE2 may not be visible. The lower pillar BE1 and the upper pillar BE2 may each have an inclined sidewall. The bottom electrodes BE may each have an inflection point PS at its sidewall between the lower pillar BE1 and the upper pillar BE2. The lower pillar BE1 may have an upper portion wider than a lower portion of the upper pillar BE2. The lower pillar BE1 may have a top surface BE1U that is partially exposed.

In some embodiments, the upper pillar BE2 may not cover a portion of the top surface BE1U of the lower pillar BE1 as illustrated in FIG. 12. The sidewall of the lower pillar BE1 may contact first and second support patterns 112a and 112b that are spaced apart from each other. The sidewall of the upper pillar BE2 may contact third and fourth support patterns 112c and 112d that are spaced apart from each other. The dielectric layer DL may extend to contact the third and fourth support patterns 112c and 112d. The lower and upper pillars BE1 and BE2 may have the first doping region 5 and the second doping region 7 that are formed adjacent to their surfaces in contact with none of the first to fourth support patterns 112a to 112d. Neither the first doping region 5 nor the second doping region 7 may be formed between the lower pillar BE1 and the upper pillar BE2 (e.g., adjacent an interface between the lower pillar BE1 and the upper pillar BE2). Other components are the same as or similar to those discussed with reference to FIGS. 1, 5, and 6.

Figure 13:
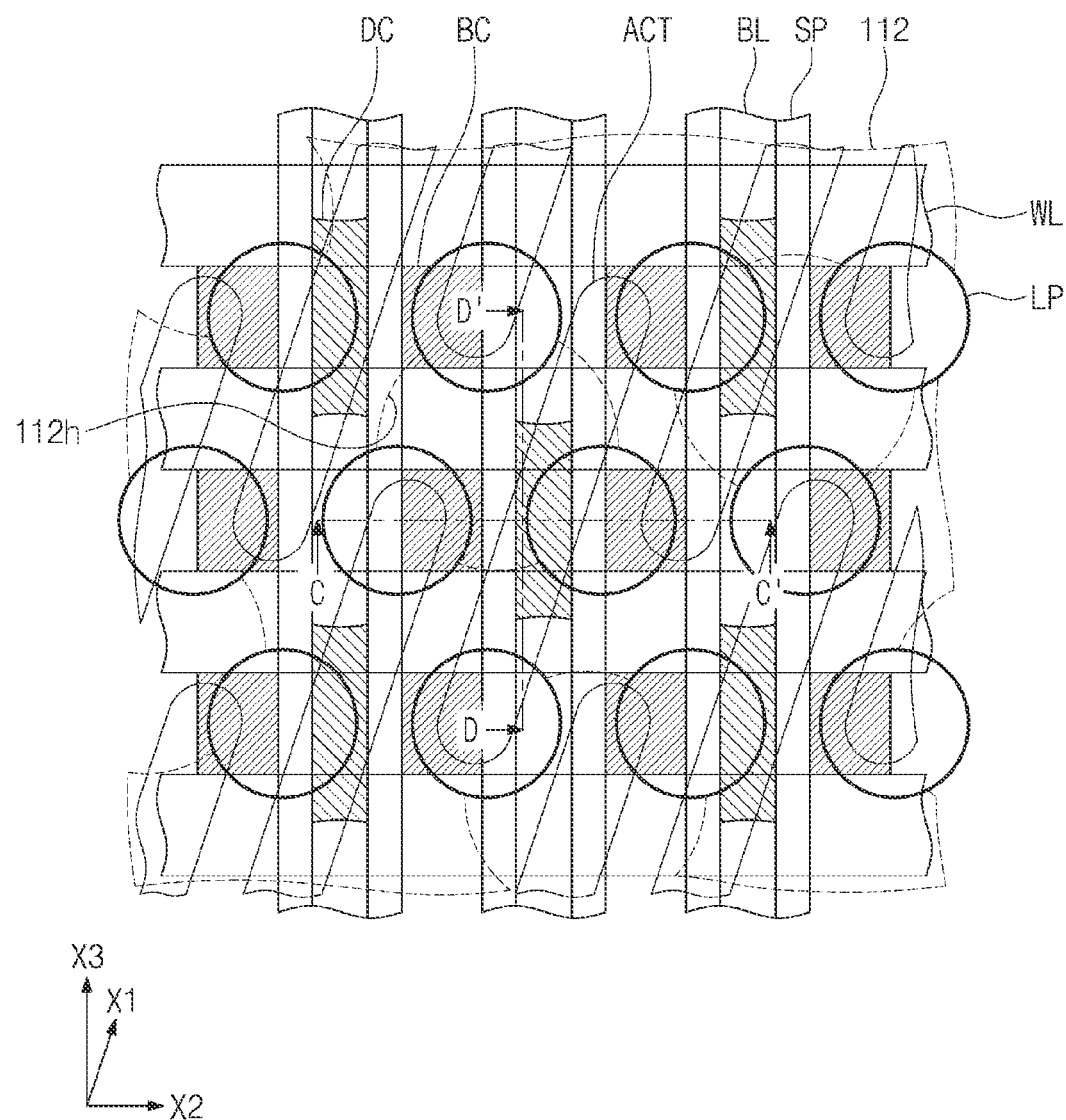
FIG. 13 illustrates a plan view of a semiconductor device according to some example embodiments of the present inventive concepts.
Figure 14:
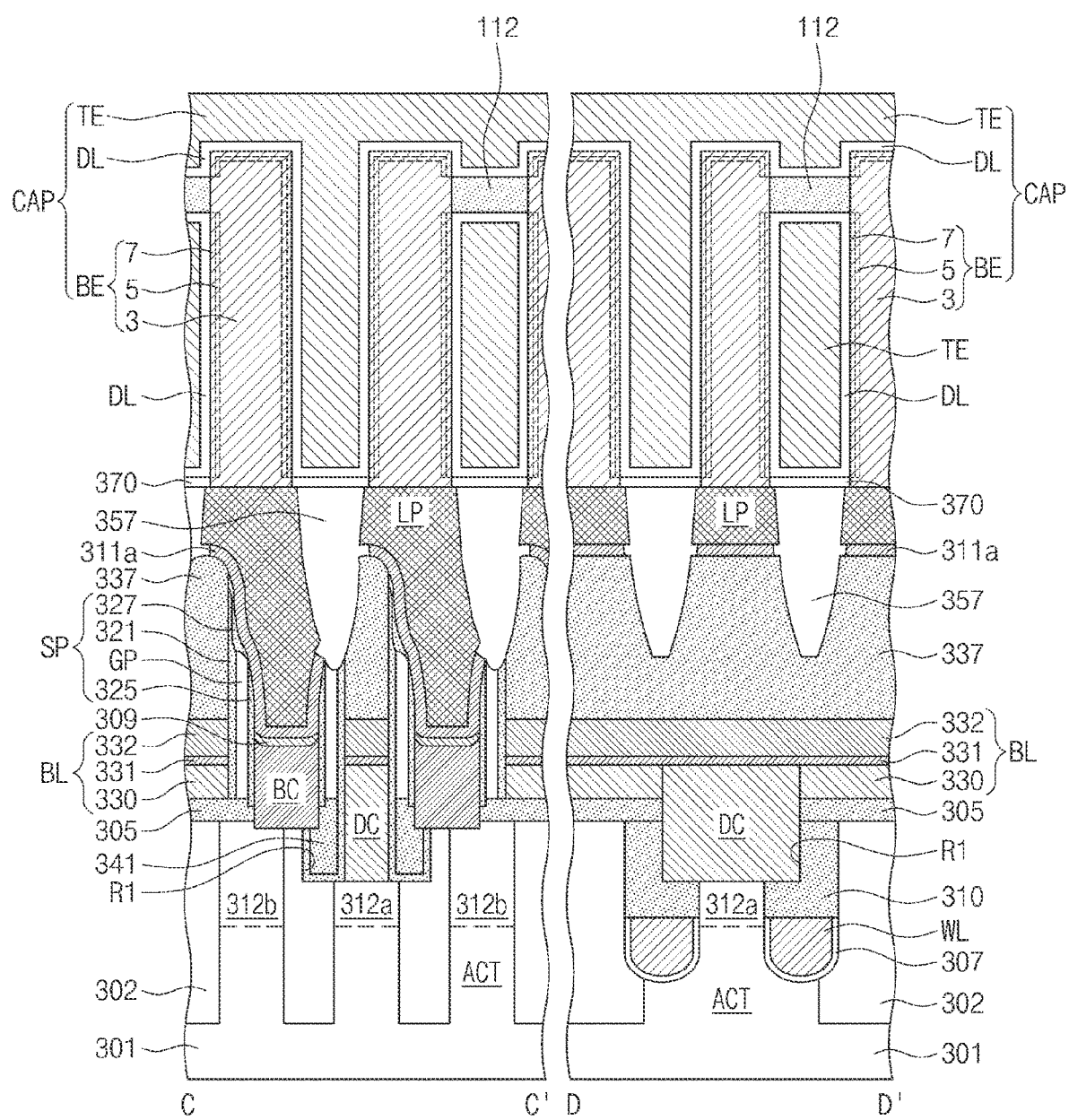
FIG. 14 illustrates a cross-sectional view taken along lines C-C' and D-D' of FIG. 13.

FIG. 13 illustrates a plan view of a semiconductor device according to some example embodiments of the present inventive concepts. FIG. 14 illustrates a cross-sectional view taken along lines C-C' and D-D' of FIG. 13.

Referring to FIGS. 13 and 14, device isolation patterns 302 may be disposed in a substrate 301, thereby defining active sections ACT. Each of the active sections ACT may have an isolated shape. The active sections ACT may be spaced apart from each other as illustrated in FIG. 13. Each of the active sections ACT may have a bar shape or a line shape elongated along a first direction X1 when viewed in plan. When viewed in plan, the active sections ACT may correspond to portions of the substrate 301 that are surrounded by the device isolation patterns 302. The substrate 301 may include a semiconductor material. The active sections ACT may be arranged parallel to each other in the first direction X1, and one of the active sections ACT may have an end portion adjacent to a central portion of a neighboring one of the active sections ACT.

Word lines WL may run across the active sections ACT. The word lines WL may be disposed in grooves formed in the device isolation patterns 302 and the active sections ACT. The word lines WL may be parallel to a second direction X2 that intersects the first direction XL. The word lines WL may be formed of a conductive material. A gate dielectric layer 307 may be disposed between each of the word lines WL and an inner surface of each groove. Although not shown, the grooves may have their bottom surfaces located relatively deeper in the device isolation patterns 302 and relatively shallower in the active sections ACT. The gate dielectric layer 307 may include, for example, thermal oxide, silicon nitride, silicon oxynitride, and/or high-k dielectric. Each of the word lines WL may have a curved bottom surface.

A first doped region 312a may be disposed in the active section ACT between a pair of word lines WL, and a pair of second doped regions 312b may be disposed in opposite edge portions of each active section ACT. The first and second doped regions 312a and 312b may be doped with, for example, impurities (e.g., N-type impurities). The first doped region 312a may correspond to a common drain region, and the second doped regions 312b may correspond to source regions. A transistor may include each of the word lines WL and its adjacent first and second doped regions 312a and 312b. As the word lines WL are disposed in the grooves, each of the word lines WL may have thereunder a channel region whose length becomes increased within a limited planar area. Accordingly, short-channel effects may be reduced or minimized.

The word lines WL may have their top surfaces lower than those of the active sections ACT. A word-line capping pattern 310 may be disposed on each of the word lines WL. The word-line capping patterns 310 may have their linear shapes that extend along longitudinal directions of the word lines WL (e.g., a second direction X2) and may cover entire top surfaces of the word lines WL. The grooves may have inner spaces not occupied by the word lines WL, and the word-line capping patterns 310 may fill the unoccupied inner spaces of the grooves. The word-line capping pattern 310 may be formed of, for example, a silicon nitride layer. As used herein, "a surface V is lower than a surface W" (or similar language) may mean that the surface V is closer than the surface W to a substrate, and the surface V is lower than the surface W relative to the substrate.

An interlayer dielectric pattern 305 may be disposed on the substrate 301. The interlayer dielectric pattern 305 may be formed of a single or multiple layer including, for example, a silicon oxide layer, a silicon nitride layer, and/or a silicon oxynitride layer. The interlayer dielectric patterns 305 may be formed to have island shapes spaced apart from each other when viewed in plan. The interlayer dielectric pattern 305 may be formed to simultaneously cover end portions of two adjacent active sections ACT.

Upper portions of the substrate 301, the device isolation pattern 302, and the word-line capping pattern 310 may be partially recessed to form a first recess region R1. The first recess region R1 may have a net shape when viewed in plan. The first recess region R1 may have a sidewall aligned with that of the interlayer dielectric pattern 305. In some embodiments, the sidewall of the interlayer dielectric pattern 305 may define a portion of the first recess region R1.

Bit lines BL may be disposed on the interlayer dielectric pattern 305. The bit lines BL may run across the word-line capping patterns 310 and the word lines WL. As shown in FIG. 13, the bit lines BL may be parallel to a third direction X3 that intersects the first and second directions X1 and X2. Each of the bit lines BL may include a bit-line polysilicon pattern 330, a bit-line ohmic pattern 331, and a bit-line metal-containing pattern 332 that are sequentially stacked. The bit-line polysilicon pattern 330 may include impurity-doped polysilicon or impurity-undoped polysilicon. The bit-line ohmic pattern 331 may include, for example, a metal silicide layer. The bit-line metal-containing pattern 332 may include, for example, metal (e.g., tungsten, titanium, or tantalum) and/or conductive metal nitride (e.g., titanium nitride, tantalum nitride, or tungsten nitride). A bit-line capping pattern 337 may be disposed on each of the bit lines BL. The bit-line capping patterns 337 may be formed of a dielectric material, such as a silicon nitride layer.

Bit-line contacts DC may be disposed in the first recess regions R1 that intersect the bit lines BL. The bit-line contacts DC may include, for example, impurity-doped polysilicon or impurity-undoped polysilicon. In some embodiments, as shown in FIG. 14, the bit-line contact DC may have a sidewall in contact with that of the interlayer dielectric pattern 305. When viewed in plan as shown in FIG. 13, the bit-line contact DC may have a concave lateral surface in contact with the interlayer dielectric pattern 305. The bit-line contact DC may electrically connect the first doped region 312a to the bit line BL.

The first recess region R1 may have a portion not occupied by the bit-line contact DC, and a lower buried dielectric pattern 341 may be formed in the portion of the first recess region R1. The lower buried dielectric pattern 341 may be formed of a single or multiple layer, for example, a silicon oxide layer, a silicon nitride layer, and/or a silicon oxynitride layer.

Storage node contacts BC may be disposed between a pair of neighboring bit lines BL. The storage node contacts BC may be spaced apart from each other. The storage node contacts BC may include, for example, impurity-doped polysilicon or impurity-undoped polysilicon. The storage node contacts BC may have their concave top surfaces. Between the bit lines BL, a dielectric pattern (not shown) may be disposed between the storage node contacts BC.

A bit-line spacer SP may be interposed between the bit line BL and the storage node contact BC. The bit-line spacer SP may include a first sub-spacer 321 and a second sub-spacer 325 that are spaced apart from each other by a gap GP intervening therebetween. The gap GP may be called an air gap. The first sub-spacer 321 may cover a sidewall of the bit line BL and a sidewall of the bit-line capping pattern 337. The second sub-spacer 325 may be adjacent to the storage node contact BC. In some embodiments, the first sub-spacer 321 and the second sub-spacer 325 may include the same material. For example, the first sub-spacer 321 and the second sub-spacer 325 may include a silicon nitride layer. In some embodiments, the air gap may not include a liquid or solid material therein and may be a void or cavity. The air gap may include, for example, air and/or an inert gas or may be a vacuum.

The second sub-spacer 325 may have a bottom surface lower than that of the first sub-spacer 321. The second sub-spacer 325 may have a top end whose height is lower than that of a top end of the first sub-spacer 321. Such a configuration may increase a formation margin for landing pads LP which will be discussed below. As a result, disconnection between the landing pad LP and the storage node contact BC may be reduced or prevented. The first sub-spacer 321 may extend to cover a sidewall of the bit-line contact DC and also to cover a sidewall and a bottom surface of the first recess region R1. For example, the first sub-spacer 321 may be interposed between the bit-line contact DC and the lower buried dielectric pattern 341, between the word-line capping pattern 310 and the lower buried dielectric pattern 341, between the substrate 301 and the lower buried dielectric pattern 341, and between the device isolation pattern 302 and the lower buried dielectric pattern 341.

A storage node ohmic layer 309 may be disposed on the storage node contact BC. The storage node ohmic layer 309 may include, for example, metal silicide. The storage node ohmic layer 309, the first and second sub-spacers 321 and 325, and the bit-line capping pattern 337 may be conformally covered with a diffusion stop pattern 311a whose thickness is uniform. The diffusion stop pattern 311a may include, for example, metal nitride, such as a titanium nitride layer and/or a tantalum nitride layer. A landing pad LP may be disposed on the diffusion stop pattern 311a. The landing pad LP may correspond to the storage node contact 106 of FIG. 5. For example, the landing pad LP may be formed of a material that contains metal, such as tungsten. The landing pad LP may have an upper portion that covers a top surface of the bit-line capping pattern 337 and has a width greater than that of the storage node contact BC. A center of the landing pad LP may shift in the second direction X2 away from a center of the storage node contact BC. In some embodiments, the center of the landing pad LP in the second direction X2 may be offset from the center of the storage node contact BC in the second direction X2 as illustrated in FIG. 14. A portion of the bit line BL may vertically overlap the landing pad LP. An upper sidewall of the bit-line capping pattern 337 may overlap (e.g., horizontally overlap) the landing pad LP and may be covered with a third sub-spacer 327. A pad separation pattern 357 may be interposed between the landing pads LP. The pad separation pattern 357 may correspond to the interlayer dielectric layer 104 of FIG. 5. The pad separation pattern 357 may include, for example, a silicon nitride layer, a silicon oxide layer, a silicon oxynitride layer, or/and a porous layer. The pad separation pattern 357 may define a top end of the gap GP.

Bottom electrodes BE may be disposed on corresponding landing pads LP. The bottom electrodes BE may each include a main region 3, a first doping region 5, and a second doping region 7 that are discussed with reference to FIG. 5. Portions of sidewalls of the bottom electrodes BE may be connected to each other through a support pattern 112. The support pattern 112 may include a plurality of support holes 112h. The main region 3 may contact the sidewall of each of the bottom electrodes BE that is in contact with the support pattern 112.

An etch stop layer 370 may cover a top surface of the pad separation pattern 357 between the bottom electrodes BE. In some embodiments, the etch stop layer 370 may include a dielectric material, such as a silicon nitride layer, a silicon oxide layer, and/or a silicon oxynitride layer. A dielectric layer DL may cover surfaces of the bottom electrodes BE and a surface of the support pattern 112. The dielectric layer DL may be covered with a top electrode TE.

A semiconductor device according to some example embodiments of the present inventive concepts may be configured such that the gap GP is interposed between the first and second sub-spacers 321 and 325, and that the bit line BL and the storage node contact BC have therebetween a reduced parasitic capacitance because a dielectric constant of air, gas, and a vacuum space is less than that of silicon oxide.

Figure 15A:
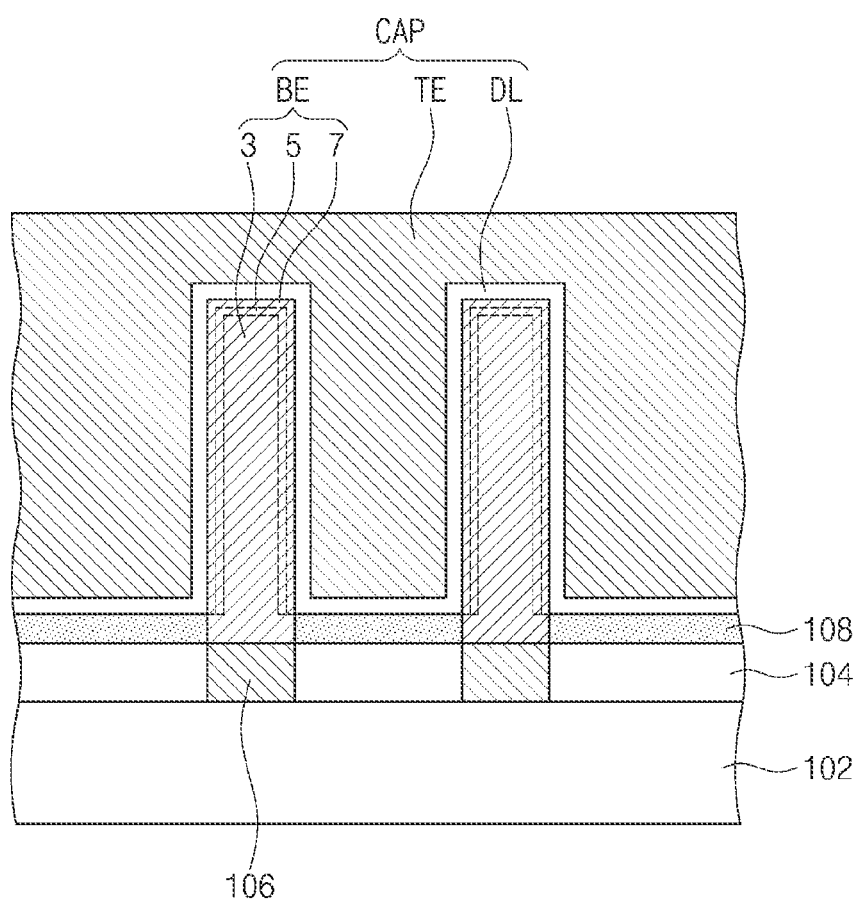
FIG. 15A illustrates a cross-sectional view of a semiconductor device according to some example embodiments of the present inventive concepts.

FIG. 15A illustrates a cross-sectional view of a semiconductor device according to some example embodiments of the present inventive concepts.

Referring to FIG. 15A, a storage node contact 106 and an interlayer dielectric layer 104 may be disposed on a semiconductor substrate 102. An etch stop layer 108 may be disposed on the interlayer dielectric layer 104. A bottom electrode BE may penetrate the etch stop layer 108 and may contact the storage node contact 106. None of the support patterns 112a and 112b of FIG. 5 are present. Instead, the etch stop layer 108 may serve to support the bottom electrodes BE. A first doping region 5 and a second doping region 7 may be formed on all lateral surface of the bottom electrode BE. Other components are the same as or similar to those discussed with reference to FIGS. 1, 5, and 6.

Figure 15B:
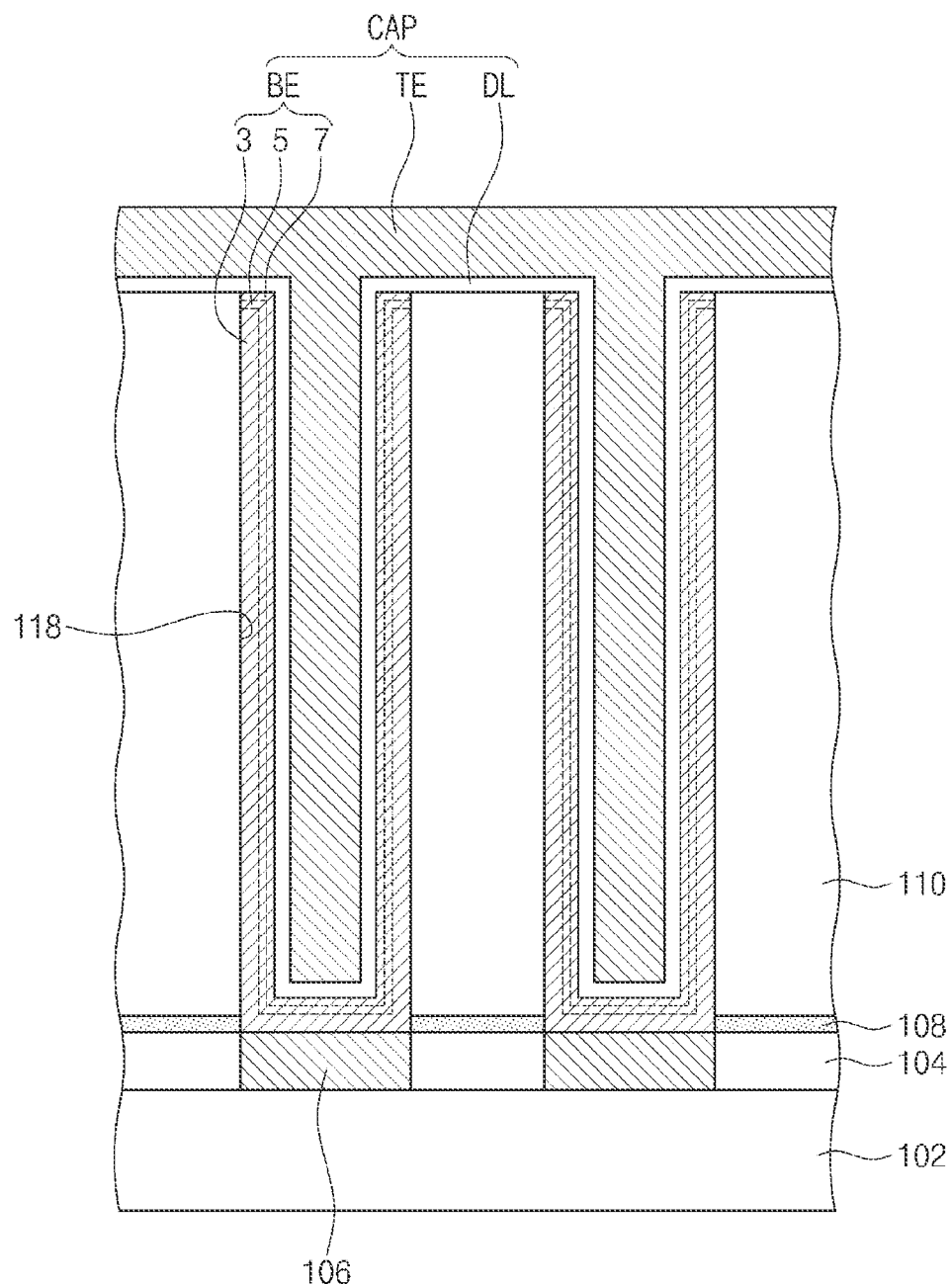
FIG. 15B illustrates a cross-sectional view of a semiconductor device according to some example embodiments of the present inventive concepts.

FIG. 15B illustrates a cross-sectional view of a semiconductor device according to some example embodiments of the present inventive concepts.

Referring to FIG. 15B, a storage node contact 106 and an interlayer dielectric layer 104 may be disposed on a semiconductor substrate 102. An etch stop layer 108 may be disposed on the interlayer dielectric layer 104. A mold layer 110 may be disposed on the etch stop layer 108. The mold layer 110 may include a bottom electrode hole 118 that exposes the storage node contact 106. A bottom electrode BE may be disposed in the bottom electrode hole 118. The bottom electrode BE may have a hollow cup or cylindrical shape. The bottom electrode BE may have an outer sidewall in contact with the mold layer 110. The bottom electrode BE may have a top surface coplanar with that of the mold layer 110. A first doping region 5 and a second doping region 7 may be formed adjacent to an inner sidewall of the bottom electrode BE. None of the support patterns 112a and 112b of FIG. 2 are present. Instead, the mold layer 110 may serve to support the bottom electrode BE. Other components are the same as or similar to those discussed with reference to FIGS. 1, 5, and 6.

Figure 16:
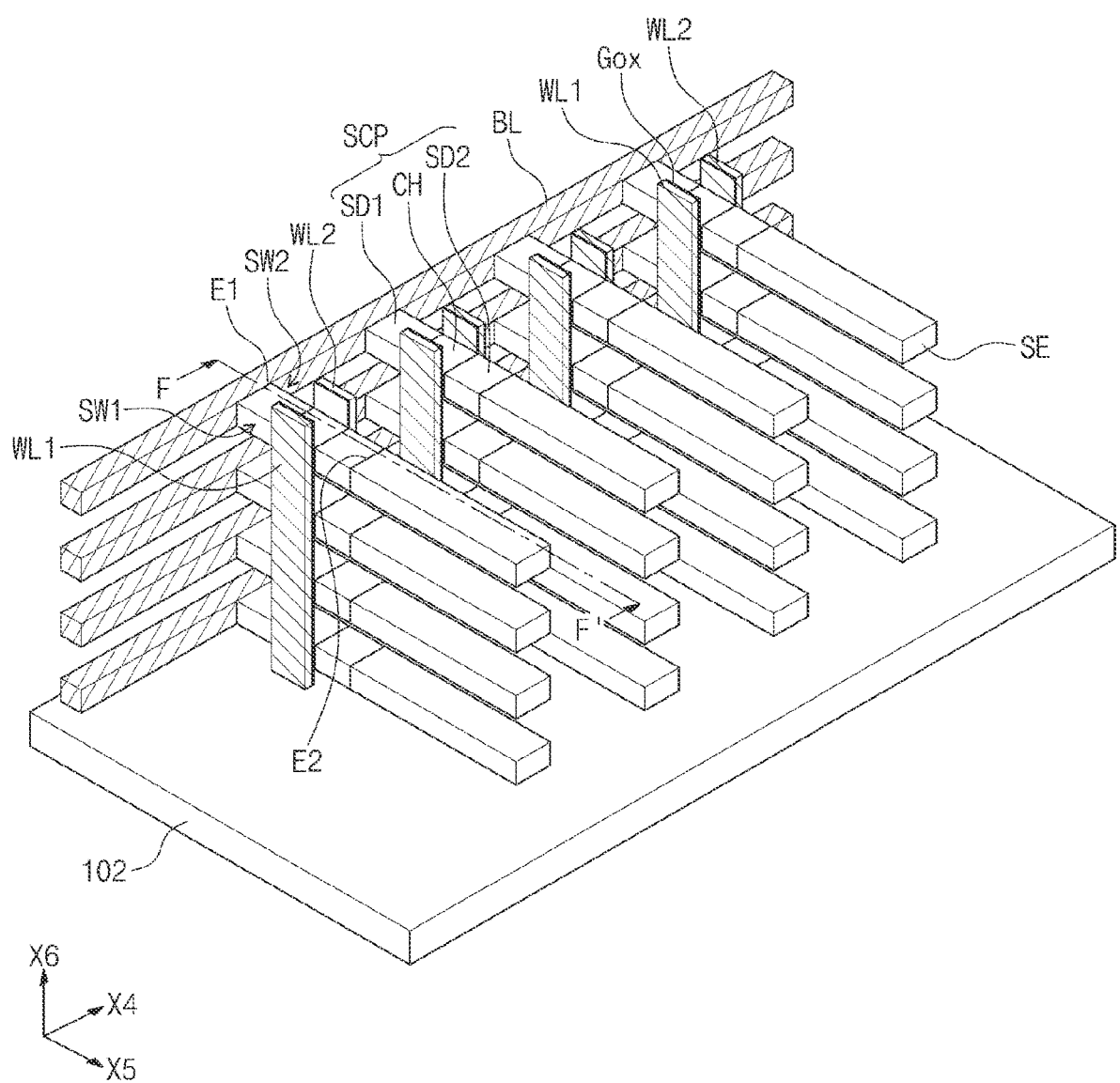
FIG. 16 illustrates a perspective view of a three-dimensional semiconductor memory device according to some example embodiments of the present inventive concepts.
Figure 17:
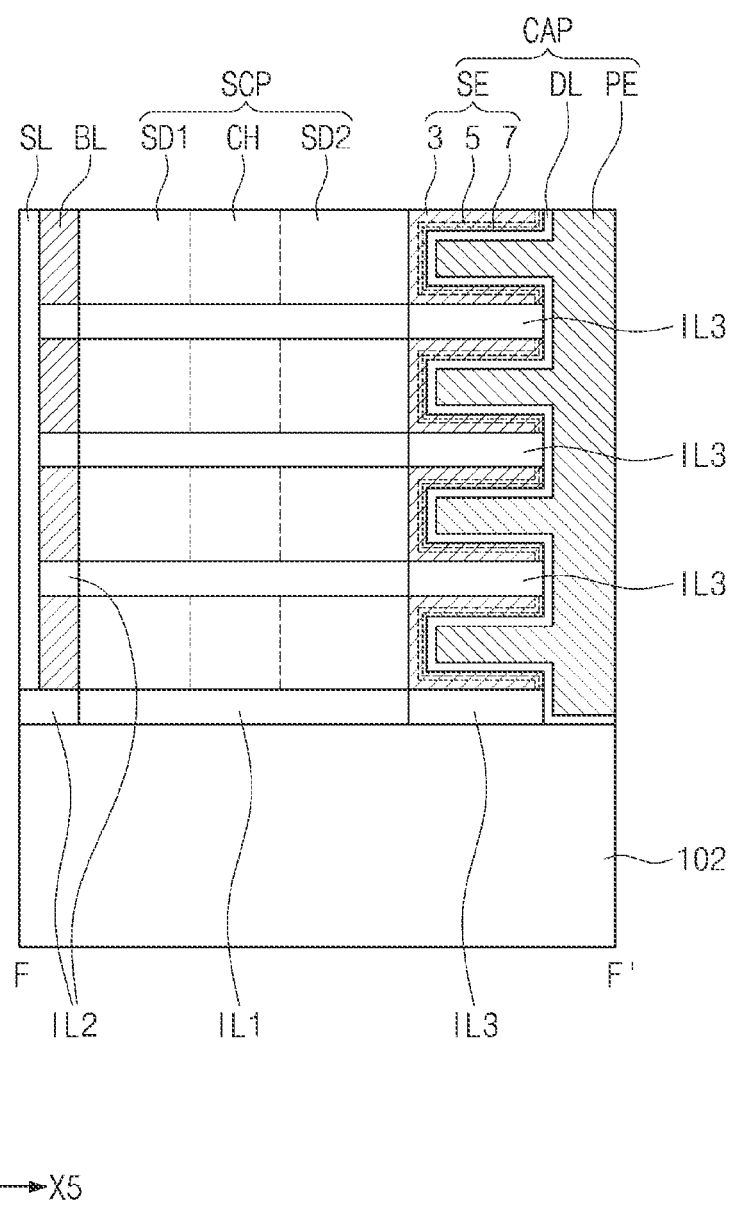
FIG. 17 illustrates a cross-sectional view taken along line F-F' of FIG. 16.

FIG. 16 illustrates a perspective view of a three-dimensional semiconductor memory device according to some example embodiments of the present inventive concepts. FIG. 17 illustrates a cross-sectional view taken along a line F-F' of FIG. 16.

Referring to FIGS. 16 and 17, a semiconductor substrate 102 may be provided thereon with semiconductor patterns SCP spaced apart from each other in a fourth direction X4 and a sixth direction X6 that intersect each other. The semiconductor patterns SCP may each have a bar shape elongated in a fifth direction X5 that intersects the fourth and sixth directions X4 and X6. The fourth and fifth directions X4 and X5 may be parallel to a top surface of the semiconductor substrate 102. The sixth direction X6 may be perpendicular to the top surface of the semiconductor substrate 102. The semiconductor patterns SCP may each have a first end portion E1 and a second end portion E2 that are spaced apart from each other in the fifth direction X5. In addition, the semiconductor patterns SCP may each have a first lateral surface SW1 and a second lateral surface SW2 that connect the first and second end portions E1 and E2 to each other and are spaced apart from each other in the fourth direction X4. The semiconductor patterns SCP may include, for example, silicon and/or germanium. The semiconductor patterns SCP may each include a first source/drain region SD1 adjacent to the first end portion E1, a second source/drain region SD2 adjacent to the second end portion E2, and a channel region CH between the first source/drain region SD1 and the second source/drain region SD2. The first and second source/drain regions SD1 and SD2 may each be an impurity-doped region formed in the semiconductor pattern SCP. The channel region CH may also be doped with impurities. For example, the first and second source/drain regions SD1 and SD2 may be doped with impurities having a first conductivity type, and the channel region CH may be doped with impurities having a second conductivity type opposite to the first conductivity type.

The semiconductor substrate 102 may be provided thereon with bit lines BL that are stacked in and spaced apart from each other in the sixth direction X6. The bit lines BL may extend in the fourth direction X4. The first end portions E1 of the semiconductor patterns SCP at the same height may be connected to a single bit line BL.

The second end portion E2 of the semiconductor pattern SCP may be connected to a first electrode SE. The first electrode SE may correspond to the bottom electrode BE of FIG. 1. The first electrode SE may include a main region 3, a first doping region 5, and a second doping region 7. The first electrode SE may have a hollow cup or cylindrical shape that lies on its side. The first doping region 5 and the second doping region 7 may be formed adjacent to inner and lateral surfaces of the first electrode SE.

First word lines WL1 may be adjacent to the first sidewalls SW1 of the semiconductor patterns SCP. Second word lines WL2 may be adjacent to the second sidewalls SW2 of the semiconductor patterns SCP. The first and second word lines WL1 and WL2 may extend in the sixth direction X6 from the top surface of the semiconductor substrate 102. One first word line WL1 may be spaced apart from one second word line WL2 by the channel region CH of one semiconductor pattern SCP intervening therebetween. Gate dielectric layers Gox may be interposed between the semiconductor patterns SCP and the first and second word lines WL1 and WL2. The gate dielectric layer Gox may include, for example, a high-k dielectric layer, a silicon oxide layer, a silicon nitride layer, and/or a silicon oxynitride layer. For example, the high-k dielectric layer may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

The bit lines BL and the first and second word lines WL1 and WL2 may each include a conductive material. For example, the conductive material may include doped semiconductor (doped silicon, doped germanium, etc.), conductive metal nitride (titanium nitride, tantalum nitride, etc.), metal (tungsten, titanium, tantalum, etc.), and/or metal-semiconductor compound (tungsten silicide, cobalt silicide, titanium silicide, etc.).

The bit lines BL may extend in the fourth direction X4. The bit lines BL may contact a separation dielectric pattern SL. When viewed in plan, the separation dielectric pattern SL may have a linear shape that extends in the fourth direction X4.

The first word lines WL1 may serve as gates that substantially dominate charge movement of the channel regions CH. The second word lines WL2 may serve as back gates that assist charge movement of the channel regions CH. A first interlayer dielectric layer IL1 may be interposed between the semiconductor patterns SCP. A second interlayer dielectric layer IL2 may be interposed between the bit lines BL. A third interlayer dielectric layer IL3 may be interposed between the first electrodes SE. The third interlayer dielectric layer IL3 may serve to support the first electrodes SE. The separation dielectric pattern SL may contact lateral surfaces of the bit lines BL and lateral surfaces of the second interlayer dielectric layers IL2. The first, second, and third interlayer dielectric layers IL1, IL2, and IL3 and the separation dielectric pattern SL may each be formed of a single or multiple layer including, for example, a silicon oxide layer, a silicon oxynitride layer, and/or a silicon nitride layer.

The first electrode SE may contact the third interlayer dielectric layer IL3. The first electrodes SE may contact the dielectric layer DL. The dielectric layer DL may contact a second electrode PE. The first electrode SE, the dielectric layer DL, and the second electrode PE may constitute a capacitor CAP. Other components are the same as or similar to those discussed with reference to FIGS. 1, 5, and 6.

Semiconductor devices according to the present inventive concepts may be configured such that a bottom electrode includes a doping region of a doping metal, and that the doping region has a relatively small thickness, thereby increasing capacitance.

In methods of fabricating a semiconductor device according to the present inventive concepts, a nitrogen source gas may be supplied when a doping layer is formed, and thus oxidation of a bottom electrode may be reduced or prevented. As a result, process failure may be reduced to increase a yield.

Although some example embodiments of the present inventive concepts have been discussed with reference to accompanying figures, it will be understood that various changes in form and details may be made therein without departing from the spirit and scope of the present inventive concepts. It therefore will be understood that the embodiments described above are just illustrative but not limitative in all aspects. Accordingly, the appended claims are intended to cover all such modifications and enhancements, which fall within the scope of the present inventive concepts.

What is claimed is:

1. A semiconductor device comprising a bottom electrode, a dielectric layer, and a top electrode sequentially stacked,
wherein the bottom electrode includes:
a main region;
a first doping region between the main region and the dielectric layer and contacting the dielectric layer; and
a second doping region between the first doping region and the main region,
wherein each of the first and second doping regions includes oxygen and a metallic dopant, and the second doping region includes nitrogen,
wherein the main region is devoid of the metallic dopant, and
wherein an oxygen concentration in the second doping region is lower than an oxygen concentration in the first doping region.

2. The semiconductor device of claim 1, wherein:
the main region includes nitrogen;
the first doping region is devoid of nitrogen; and
a nitrogen concentration in the main region is greater than a nitrogen concentration in the second doping region.

3. The semiconductor device of claim 1, wherein a sum of thicknesses of the first and second doping regions is in a range of about 1 Å to about 10 Å.

4. The semiconductor device of claim 1, further comprising a support pattern in contact with an upper portion of a side surface of the bottom electrode,
wherein the main region is in contact with the support pattern.

5. The semiconductor device of claim 4, wherein the first doping region and the second doping region are in contact with the support pattern.

6. The semiconductor device of claim 1, further comprising an etch stop layer in contact with a lower portion of a side surface of the bottom electrode,
wherein the main region is in contact with the etch stop layer.

7. The semiconductor device of claim 1, further comprising an interlayer dielectric layer in contact with a portion of a side surface of the bottom electrode,
wherein the main region is in contact with the interlayer dielectric layer.

8. The semiconductor device of claim 1, wherein the metallic dopant includes V, Nb, Ta, Mo, Cr, Sb, and/or As.

9. The semiconductor device of claim 1, further comprising:
a substrate;
a device isolation pattern on the substrate and defining an active region;
a word line in the substrate and traversing the active region;
a first impurity region in the active region adjacent a first side of the word line;
a second impurity region in the active region adjacent a second side of the word line;
a bit line electrically connected to the first impurity region and on the substrate; and
a support pattern comprising a surface that contacts the bottom electrode,
wherein the bottom electrode is electrically connected to the second impurity region, and the dielectric layer contacts the support pattern and the bottom electrode.

10. The semiconductor device of claim 9, wherein the main region contacts a first portion of the surface of the support pattern.

11. The semiconductor device of claim 10, wherein the first doping region and the second doping region contact a second portion of the surface of the support pattern.

12. The semiconductor device of claim 9, wherein:
the bottom electrode has a circular shape in a plan view; and
each of the first and second doping regions has an arc shape in the plan view.

13. The semiconductor device of claim 1, wherein the first doping region is devoid of nitrogen.

14. A semiconductor device comprising a bottom electrode, a dielectric layer, and a top electrode sequentially stacked,
wherein the bottom electrode includes:
a main region; and
a doping region between the main region and the dielectric layer;
wherein the doping region includes oxygen, nitrogen, and a metallic dopant,
wherein the main region is devoid of the metallic dopant, and
wherein an oxygen concentration in the doping region decreases with decreasing distance from the main region.

15. The semiconductor device of claim 14, wherein a thickness of the doping region is in a range of about 1 Å to about 10 Å.

16. The semiconductor device of claim 14, wherein the doping region includes:
a first doping region in contact with the dielectric layer; and
a second doping region spaced apart from the dielectric layer by the first doping region therebetween,
wherein the first doping region is devoid of nitrogen,
wherein each of the second doping region and the main region includes nitrogen, and
wherein a nitrogen concentration in the main region is greater than a nitrogen concentration in the second doping region.

17. The semiconductor device of claim 14, further comprising a support pattern in contact with an upper portion of a side surface of the bottom electrode,
wherein the main region is in contact with the support pattern.

18. A semiconductor device comprising a capacitor,
wherein the capacitor comprises a bottom electrode, a top electrode, and a dielectric layer between the bottom electrode and the top electrode,
wherein the bottom electrode comprises:
a main region; and
a doping region between the main region and the dielectric layer,
wherein the doping region comprises a first portion that is between the main region and the dielectric layer and contacts the dielectric layer and a second portion that is between the first portion and the main region,
each of the first portion and the second portion comprises oxygen and a metallic dopant, and
a nitrogen concentration in the second portion is greater than a nitrogen concentration in the first portion.

19. The semiconductor device of claim 18, wherein the first portion of the doping region is devoid of nitrogen.

20. The semiconductor device of claim 18, wherein the bottom electrode, the dielectric layer, and the top electrode are sequentially stacked in a direction, and the doping region has a thickness in the direction in a range of about 1 Å to about 10 Å.

* * * * *